United States Patent
Lin

(10) Patent No.: US 9,267,961 B2
(45) Date of Patent: Feb. 23, 2016

(54) THERMAL CONVECTION-TYPE ACCELEROMETER

(71) Applicant: CHUNG HUA UNIVERSITY, Hsinchu (TW)

(72) Inventor: Jium Ming Lin, Hsinchu (TW)

(73) Assignee: CHUNG HUA UNIVERSITY, Hsinchu (TW)

( * ) Notice: Subject to any disclaimer, the term of this patent is extended or adjusted under 35 U.S.C. 154(b) by 372 days.

(21) Appl. No.: 13/685,398

(22) Filed: Nov. 26, 2012

(65) Prior Publication Data

US 2013/0133425 A1    May 30, 2013

(30) Foreign Application Priority Data

Nov. 29, 2011    (TW) .............................. 100143669 A

(51) Int. Cl.
```
G01P 15/00      (2006.01)
B32B 37/12      (2006.01)
C23C 16/48      (2006.01)
C23C 16/56      (2006.01)
```
(52) U.S. Cl.
CPC .............. *G01P 15/008* (2013.01); *B32B 37/12* (2013.01); *C23C 16/487* (2013.01); *C23C 16/56* (2013.01); *Y10T 29/49002* (2015.01); *Y10T 156/10* (2015.01)

(58) Field of Classification Search
CPC ..................................................... G01P 15/008
USPC .......................................... 73/514.05, 514.09
See application file for complete search history.

(56) References Cited

U.S. PATENT DOCUMENTS

| | | | | |
|---|---|---|---|---|
| 5,043,023 A | * | 8/1991 | Bentley | 136/232 |
| 5,581,034 A | * | 12/1996 | Dao et al. | 73/514.09 |
| 6,182,509 B1 | * | 2/2001 | Leung | 73/514.05 |
| 6,795,752 B1 | | 9/2004 | Zhao et al. | |
| 7,069,785 B2 | | 7/2006 | Chou | |
| 7,367,232 B2 | * | 5/2008 | Vaganov et al. | 73/514.33 |
| 7,424,826 B2 | * | 9/2008 | Hua et al. | 73/514.05 |
| 8,307,708 B2 | | 11/2012 | Lin | |
| 8,580,127 B2 | | 11/2013 | Lin | |

(Continued)

FOREIGN PATENT DOCUMENTS

| | | |
|---|---|---|
| CN | 1667382 A | 9/2005 |
| CN | 1834592 A | 9/2006 |

(Continued)

OTHER PUBLICATIONS

Office Action issued on Oct. 30, 2014 from State Intellectual Property Office of the People's Republic of China for corresponding SIPO application 201110461938.X.

(Continued)

*Primary Examiner* — Hezron E Williams
*Assistant Examiner* — Mark A Shabman
(74) *Attorney, Agent, or Firm* — WPAT, P.C.; Anthony King

(57) ABSTRACT

A thermal convection-type accelerometer includes a first insulating substrate, a circuit formed on the first insulating substrate, a first acceleration-sensing device coupled with the circuit, and a first supporting layer attached on the insulating substrate. The first acceleration-sensing device includes two temperature-sensing components and a heater disposed between the temperature-sensing components. The temperature-sensing components and the heater are directly formed on the first supporting layer.

17 Claims, 31 Drawing Sheets

(56) References Cited

U.S. PATENT DOCUMENTS

| | | | |
|---|---|---|---|
| 8,601,678 | B1 | 12/2013 | Lin |
| 8,606,364 | B2 | 12/2013 | Lin |
| 2002/0017132 | A1* | 2/2002 | McNie et al. ............. 73/504.02 |
| 2006/0220662 | A1* | 10/2006 | Nakano et al. ............... 324/693 |
| 2010/0045362 | A1* | 2/2010 | Dribinsky et al. ........... 327/513 |

FOREIGN PATENT DOCUMENTS

| | | |
|---|---|---|
| CN | 101961528 A | 2/2011 |
| CN | 102012437 A | 4/2011 |
| TW | 446595 | 7/2001 |
| TW | M307828 | 3/2007 |
| TW | 200746874 A | 12/2007 |
| TW | 201105972 | 2/2011 |
| TW | 201114678 A | 5/2011 |

OTHER PUBLICATIONS

English Abstract of Office Action issued on Oct. 30, 2014 from State Intellectual Property Office of the People's Republic of China for corresponding SIPO application 201110461938.X.
U.S. Pat. No. 8,601,678 and U.S. Pat. No. 8,606,364 are the counterpart US applications for CN 101961528A.
English abstract translation of CN 101961528A.
Office Action issued on Apr. 15, 2014 by TIPO for counterpart TW Patent Application No. 100143669 cites TW 201105972.
English Abstract of Office Action issued on Apr. 15, 2014 by TIPO for counterpart TW Patent Application No. 100143669.
English Abstract of TW 201105972.
U.S. Pat. No. 8,307,708 & U.S. Pat. No. 8,580,127 correspond to TW 201105972.
Office action and search report issued on Nov. 27, 2013 to the corresponding Taiwan Application No. 100143669.
English abstract translation of office action and search report issued on Nov. 27, 2013 to the corresponding Taiwan Application No. 100143669.
Abstract translation of the CN1667382A.
Abstract translation of theTW M307828.
Office Action dated May 6, 2015 from the China (PRC) counterpart application 201110461938.X.
Search Report dated May 6, 2015 from the China (PRC) counterpart application 201110461938.X.
English abstract translation of the Office Action dated May 6, 2015 from the China (PRC) counterpart application 201110461938.X.

\* cited by examiner

THERMAL CONVECTION-TYPE ACCELEROMETER

CROSS-REFERENCE TO RELATED APPLICATION

The present application is based on, and claims priority from, Taiwan Patent Application Serial Number 100143669, filed on Nov. 29, 2011, the disclosure of which is hereby incorporated by reference herein in its entirety.

BACKGROUND OF THE INVENTION

1. Field of the Invention

The present invention relates to a thermal convection-type accelerometer, and relates more particularly to a thermal convection-type accelerometer whose heater and temperature-sensing components are not suspended.

2. Description of the Related Art

U.S. Pat. No. 6,182,509 discloses a thermal convection-type accelerometer, which comprises a silicon substrate, a heater and two temperature sensors. The silicon substrate has a deep cavity formed underneath the heater and the temperature sensors. The temperature sensors are positioned at equal distances from the heater on either side thereof.

In order to form a cavity underneath the heater and the two temperature sensors, a silicon dioxide layer is initially formed on the silicon substrate. Thereafter, a poly-silicon layer is formed on the silicon dioxide layer. Next, an oxide layer is formed on the poly-silicon layer using an oxidation process. Subsequently, the poly-silicon layer is patterned to form three poly-silicon bridges. Then, an oxidation process is performed to form an oxide layer on the sides of the poly-silicon bridges. Next, EDP (a mixture of ethylenediamine, pyrocatechol and water) is applied to etch a deep cavity.

According to the description of the above process, the process for manufacturing suspended heaters and temperature sensors is complex and results in thermal convection-type accelerometers being quite expensive. Furthermore, the slender poly-silicon bridges are easily damaged during the manufacturing of the thermal convection-type accelerometer, resulting in a low yield ratio and are easily broken when the thermal convection-type accelerometer operates for a long period of time. Moreover, the components of the above thermal convection-type accelerometer are formed on a silicon substrate. Because the silicon thermal conductivity (1.48 W/(m−K)) is larger, it can quickly dissipate the heat generated from the heater. Therefore, the heater must be formed over a cavity to reduce energy loss. However, despite forming a deep cavity underneath the heater, the silicon substrate still dissipates a significant amount of heat. As a result, thermal convection-type accelerometers using silicon as their substrates will consume larger amounts of energy. In addition, the cavities of present thermal convection-type accelerometers are filled with carbon dioxide or specified concentrations of air, and the gases may oxidize the heaters and temperature sensors, causing the thermal convection-type accelerometers to have a shorter lifespan.

As noted, conventional thermal convection-type accelerometers have some drawbacks. Therefore, a new thermal convection-type accelerometer is required.

SUMMARY OF THE INVENTION

One embodiment of the present invention provides a thermal convection-type accelerometer comprising a first insulating substrate, a circuit, a first acceleration-sensing device, and a first supporting layer. The circuit is formed on the first insulating substrate. The first acceleration-sensing device is coupled with the circuit. The first acceleration-sensing device comprises two first temperature-sensing components and a first heater disposed between the two first temperature-sensing components. The first supporting layer is attached to the first insulating substrate. The first temperature-sensing components and the first heater are directly formed on the first supporting layer.

One embodiment of the present invention provides a method for manufacturing a multiple-axis thermal convection-type accelerometer module. The method comprises forming a supporting layer on an insulating substrate; forming two temperature-sensing components directly on the supporting layer; and forming a heater directly on the supporting layer and between the two temperature-sensing components.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

In one aspect, the heater and the temperature-sensing components of a thermal convection-type accelerometer of one embodiment of the present invention are directly formed and contact an insulating substrate that is used for support. The heater and the temperature-sensing components are not suspended over a cavity. Therefore, the thermal convection-type accelerometers in the present disclosure have the following characteristics of: being easily made and endurable, and having higher acceleration operation capability, higher production yield rate and lower cost.

In one aspect, the present disclosure proposes a thermal convection-type z-axis accelerometer that transmits the output voltage through a socket connector that is connected with a signal processor and a wireless module for measuring the acceleration along the z-axis. Such a thermal convection-type accelerometer with a socket connector is easily manufactured and assembled, and can be done at a relatively low price.

Figure 1:
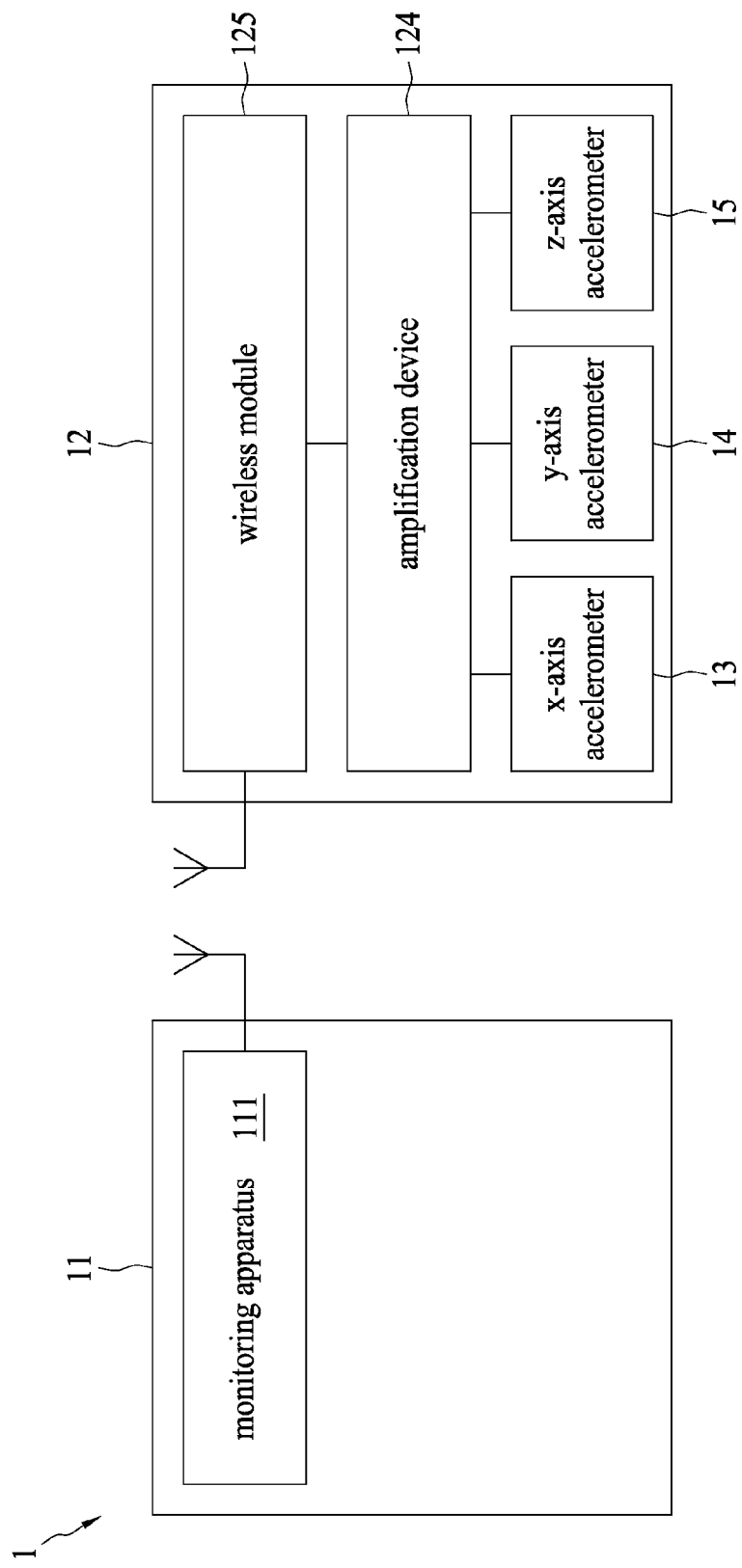
FIG. 1 shows the block diagram of a wireless multi-axis acceleration-sensing system according to one embodiment of the present invention.

FIG. 1 shows the block diagram of a wireless multi-axis acceleration-sensing system 1 according to one embodiment of the present invention. Referring to FIG. 1, the wireless multi-axis acceleration-sensing system 1 comprises a monitoring apparatus 111 and at least one wireless multi-axis thermal convection-type accelerometer module 12. The multi-axis thermal convection-type accelerometer module 12 is configured to measure accelerations along a plurality of axes. In a Cartesian coordinate system, the multi-axis thermal convection-type accelerometer module 12 can be configured to include, but is not limited to, an x-axis accelerometer 13 for measuring acceleration along the x-axis, a y-axis accelerometer 14 for measuring acceleration along the y-axis, and a z-axis accelerometer 15 for measuring acceleration along the z-axis. The x-axis accelerometer 13, the y-axis accelerometer 14 and the z-axis accelerometer 15 can be coupled with a control and amplification device 124, which is configured to control, amplify and transmit signals from the x-axis accelerometer 13, the y-axis accelerometer 14 and the z-axis accelerometer 15. The multi-axis thermal convection-type accelerometer module 12 may further comprise a wireless module 125, which can communicate with and transmit signals to/from the monitoring apparatus 11 by a communication standard protocol such that the monitoring apparatus 11 can detect anyone of the magnitude and direction of the acceleration of the multi-axis thermal convection-type accelerometer module 12. In one embodiment, the communication standard protocol may be the RFID (radio frequency identification) communication standard, the Zigbee communication standard, or the Bluetooth communication standard.

Figure 2:
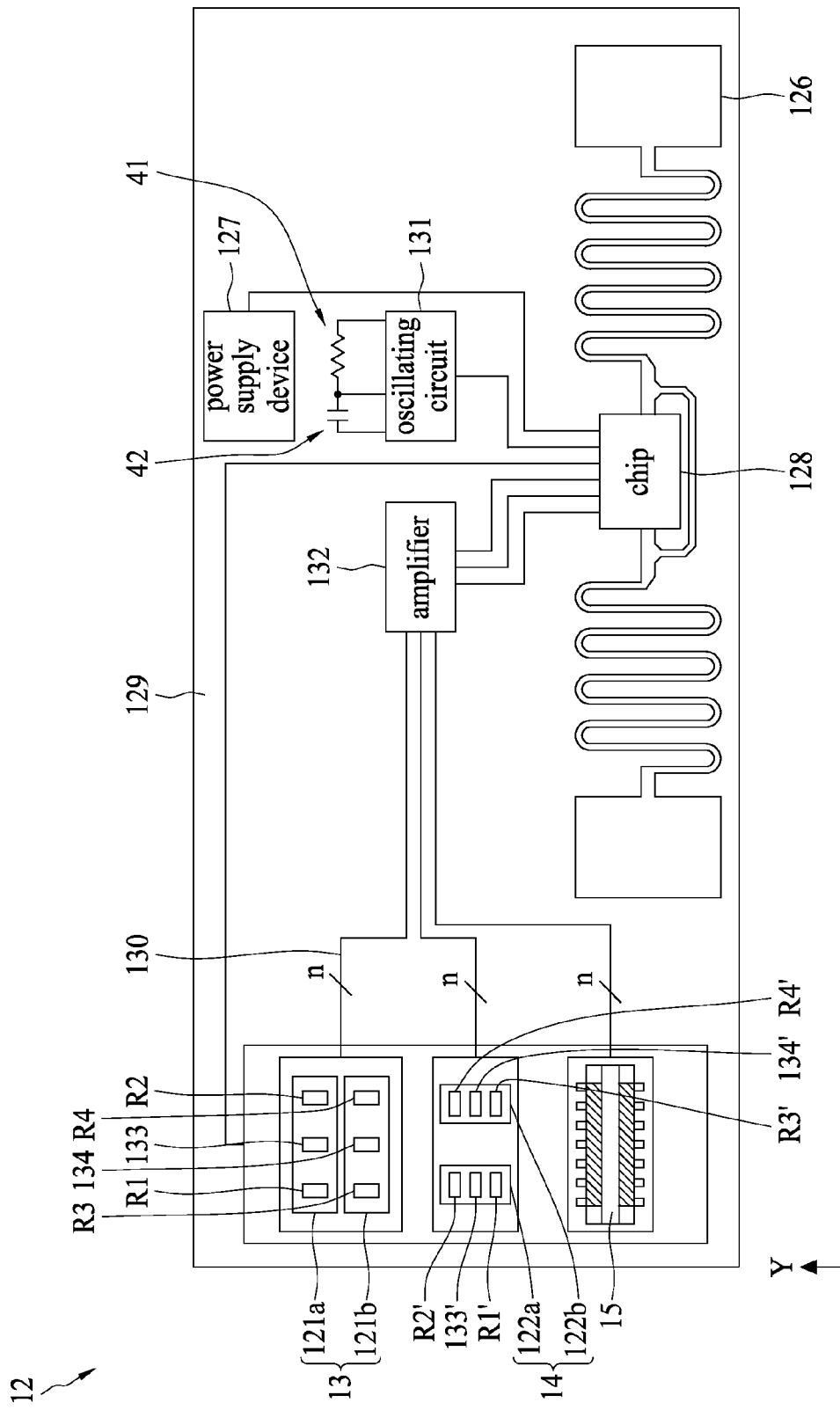
FIG. 2 shows a multi-axis thermal convection-type accelerometer module according to one embodiment of the present invention.

FIG. 2 is a schematic illustration showing a multi-axis thermal convection-type accelerometer module 12 according to one embodiment of the present invention. In one embodiment, the x-axis accelerometer 13, the y-axis accelerometer 14, the z-axis accelerometer 15, an antenna 126, a power supply device 127, and a chip 128 comprising the control and amplification device 124 can be manufactured on an insulating substrate 129 and coupled with a circuit 130 on the insulating substrate 129 to form the multi-axis thermal convection-type accelerometer module 12. The antenna 126 may be coupled with the chip 128 and the insulating substrate 129 may be a flexible insulating substrate formed of polythiophene (PT), polyethylene terephthalate (PET), or polyimide (PI). The multi-axis thermal convection-type accelerometer module 12 can be manufactured using a microelectromechanical process. The power supply device 127 is configured to supply the electrical energy required by the multi-axis thermal convection-type accelerometer module 12. A battery can be applied to supply the electrical energy required by the multi-axis thermal convection-type accelerometer module 12. The chip 128 can switch the multi-axis thermal convection-type accelerometer module 12 into a power saving mode. An oscillating circuit 131 can be further formed on the insulating substrate 129. The oscillating circuit 131 can be coupled with the chip 128 to provide the multi-axis thermal convection-type accelerometer module 12 with clock signals for operation. The oscillating circuit 131 can be an RC oscillator, which can comprise a thin film resistor and a thin film capacitor formed on the insulating substrate 129.

Furthermore, an amplifier 132 can be formed on the insulating substrate 129. The x-axis accelerometer 13, the y-axis accelerometer 14 and the z-axis accelerometer 15 can be coupled with the amplifier 132 to amplify their signals. In one embodiment, the amplifier 132 is an instrumentation amplifier.

Although the embodiment of FIG. 2 demonstrates that the x-axis accelerometer 13, the y-axis accelerometer 14, the z-axis accelerometer 15 are integrated with the wireless module and altogether formed on the same insulating substrate 129, the embodiments that have one or any two of the x-axis accelerometer 13, the y-axis accelerometer 14, and the z-axis accelerometer 15 formed on the insulating substrate 129 are included in the scope of the present invention.

Figure 3:
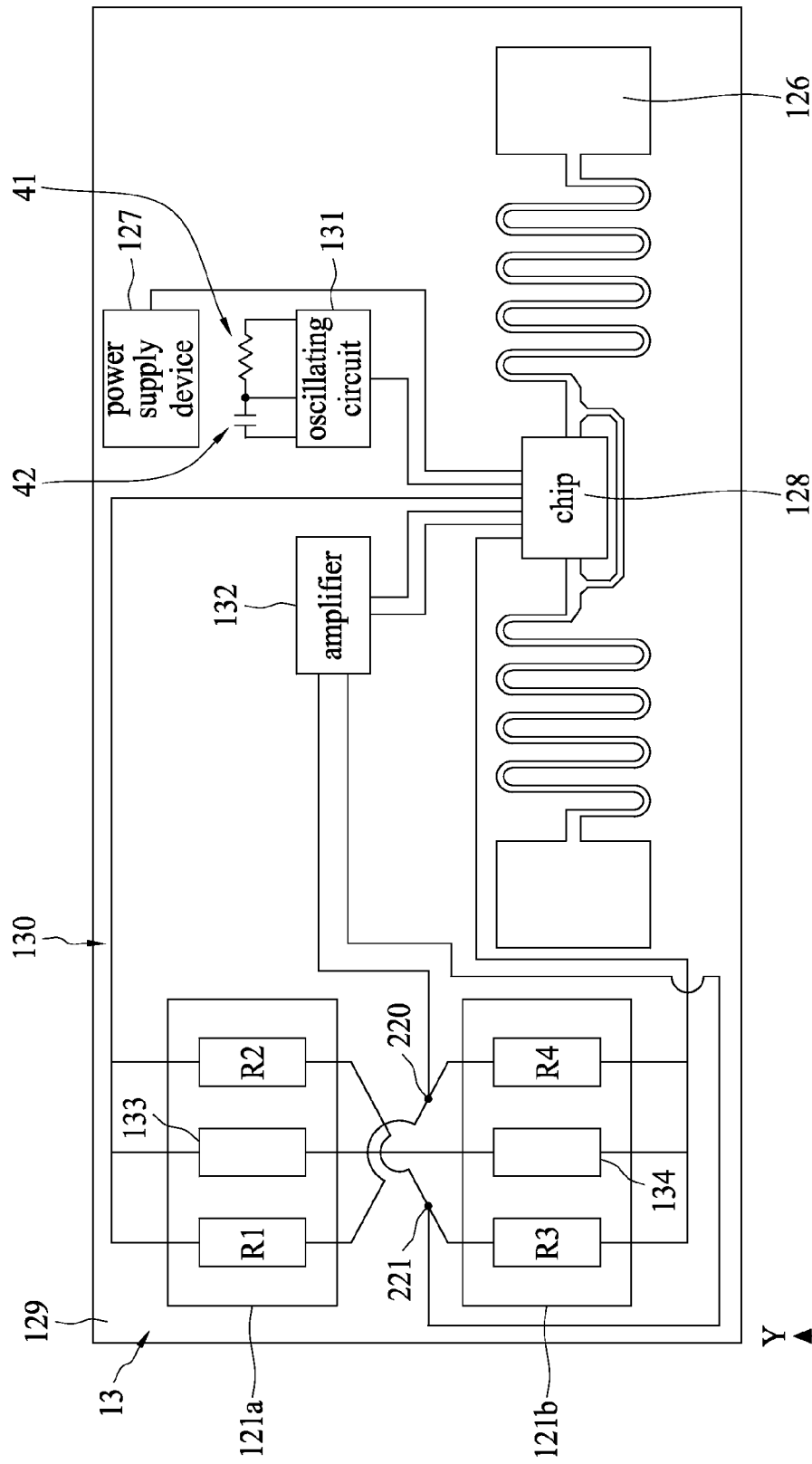
FIG. 3 shows the integration of an x-axis accelerometer with a wireless module according to one embodiment of the present invention.

FIG. 3 is a schematic illustration showing the integration of an x-axis accelerometer 13 with a wireless module according to one embodiment of the present invention. Referring to FIG. 3, the x-axis accelerometer 13 may comprise two x-axis acceleration-sensing devices 121a and 121b, each of which is coupled with a bus 130 for acquiring the necessary electrical energy and transmitting signals to the chip 128. Each x-axis acceleration-sensing devices 121a or 121b may comprise two temperature-sensing components (R1 and R2) or (R3 and R4) and a heater 133 or 134, wherein the heater 133 or 134 is disposed between the two temperature-sensing components (R1 and R2) or (R3 and R4). In one embodiment, the two temperature-sensing components (R1 and R2) or (R3 and R4) are equidistant from the heater 133 or 134.

Figure 4:
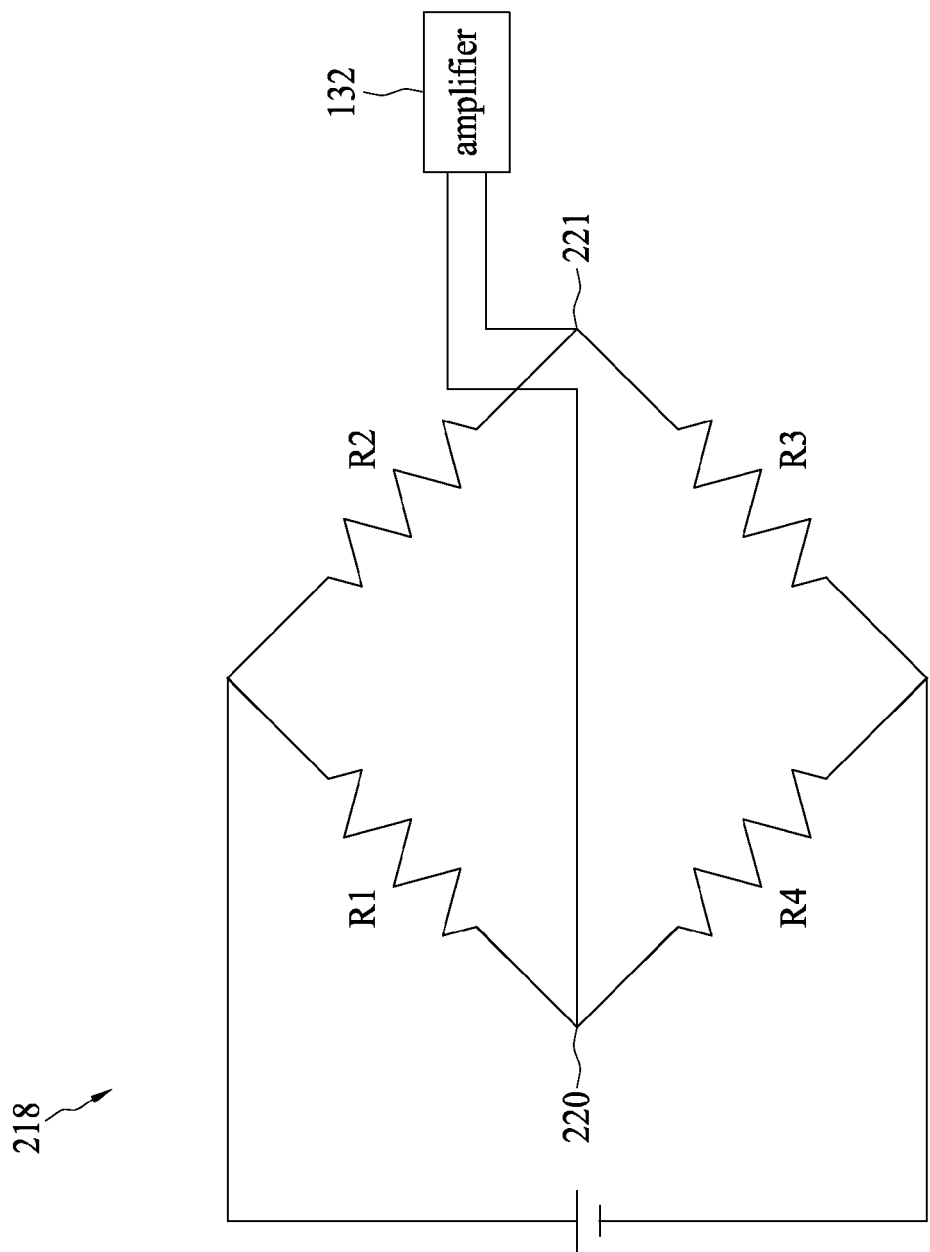
FIG. 4 shows a Wheatstone bridge formed by the temperature-sensing components according to one embodiment of the present invention.

FIG. 4 is a schematic illustration showing a Wheatstone bridge formed by the temperature-sensing components according to one embodiment of the present invention. Referring to FIGS. 3 and 4, the x-axis acceleration-sensing devices 121a and 121b are respectively coupled with the chip 128 to acquire the necessary electrical energy. Moreover, the two x-axis acceleration-sensing devices 121a and 121b are connected in a crossover manner. In other words, one of the temperature-sensing components (R1 and R2) of the x-axis acceleration-sensing devices 121a and one of the temperature-sensing components (R3 and R4) of the x-axis acceleration-sensing devices 121b on the different side of the heater 133 are connected at the same connecting point 220 or 221. As shown in FIG. 3, the temperature-sensing component R1 of the acceleration-sensing devices 121a on the left side of the heater 133 and the temperature-sensing component R4 of the acceleration-sensing devices 121b on the right side of the heater 134 are connected at the same connecting point 220; the temperature-sensing component R2 of the acceleration-sensing devices 121a on the right side of the heater 133 and the temperature-sensing component R3 of the acceleration-sensing devices 121b on the left side of the heater 134 are connected at the same connecting point 221. As such, the temperature-sensing components (R1, R2, R3 and R4) form a Wheatstone bridge 218 as shown in FIG. 4. Since the temperature-sensing components (R1, R2, R3 and R4) on different sides of the heater 133 and 134 are connected in series, a voltage difference across the two connecting points 220 and 221 may occur when the x-axis accelerometer 13 is under acceleration in an x-direction. The amplifier 132 can amplify the voltage difference and transmit the result to the chip 128 so that the chip 128 can receive such amplified voltage difference and then output the magnitude of the acceleration of x-axis accelerometer 13 to the monitoring apparatus 111 via the control and amplification device 124 and the wireless module 125 as in FIG. 1.

Referring to FIG. 2, the y-axis accelerometer 14 can be similar to the x-axis accelerometer 13 of FIG. 4. The main difference is that the heater 133 or 134 and the two temperature-sensing components (R1 and R2) or (R3 and R4) of each x-axis acceleration-sensing devices 121a or 121b in the x-axis accelerometer 13 are arranged along a direction parallel to the x-axis, while the heater 133' or 134' and the two temperature-sensing components (R1' and R2') or (R3' and R4') of each y-axis acceleration-sensing devices 122a or 122b in the y-axis accelerometer 14 are arranged along a direction parallel to the y-axis. The heater 133' or 134' of each y-axis acceleration-sensing devices 122a or 122b is disposed between the corresponding two temperature-sensing components (R1' and R2') or (R3' and R4').

The temperature-sensing components (R1', R2', R3' and R4') of the y-axis acceleration-sensing devices 122a or 122b are connected, similarly to the temperature-sensing components (R1, R2, R3 and R4) of the x-axis acceleration-sensing devices 121a and 121b, to form a Wheatstone bridge in order to generate a voltage difference. The amplifier 132 can amplify the voltage difference and the result is transmitted to the chip 128. The chip 128 determines the magnitude of the y-axis acceleration by the amplified result and then outputs the magnitude of the y-axis acceleration to the monitoring apparatus 111 via the control and amplification device 124 and the wireless module 125 as in FIG. 1.

Figure 5:
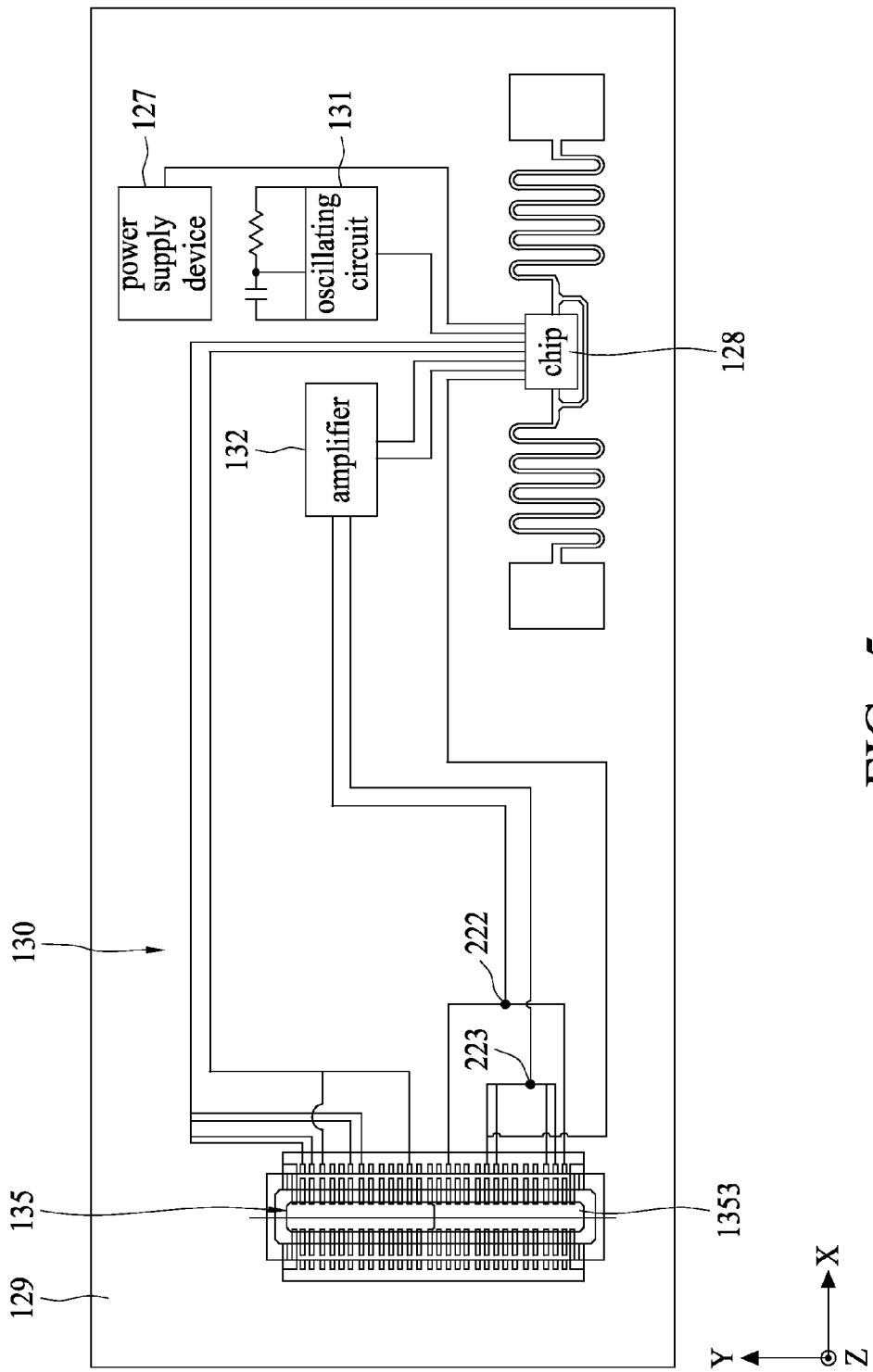
FIG. 5 shows a socket connector disposed on an insulating substrate according to one embodiment of the present invention.
Figure 6:
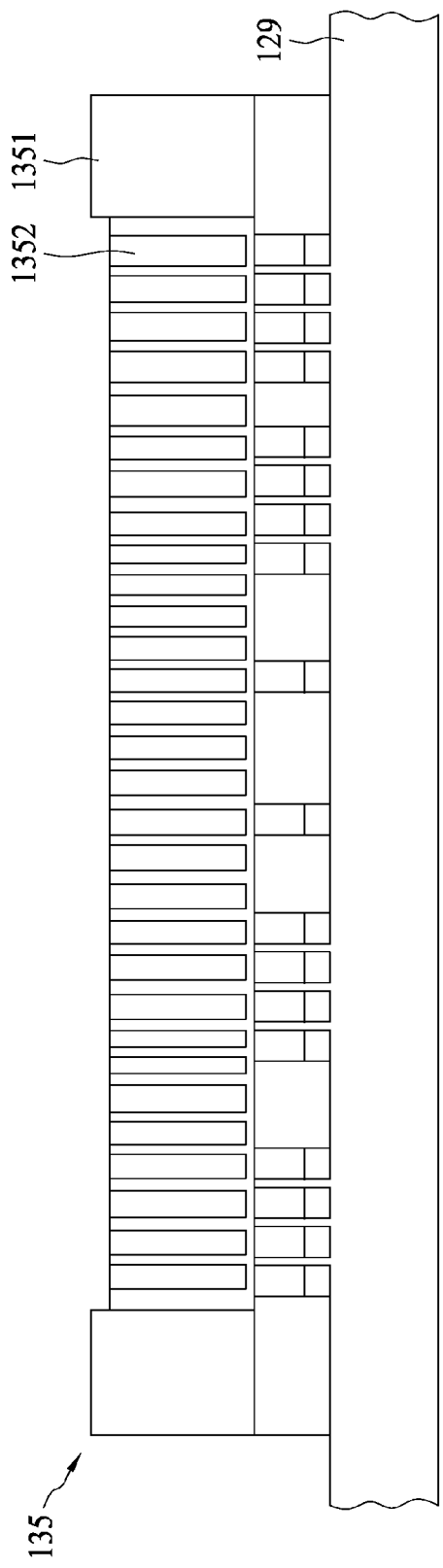
FIG. 6 shows a socket connector according to one embodiment of the present invention.
Figure 7:
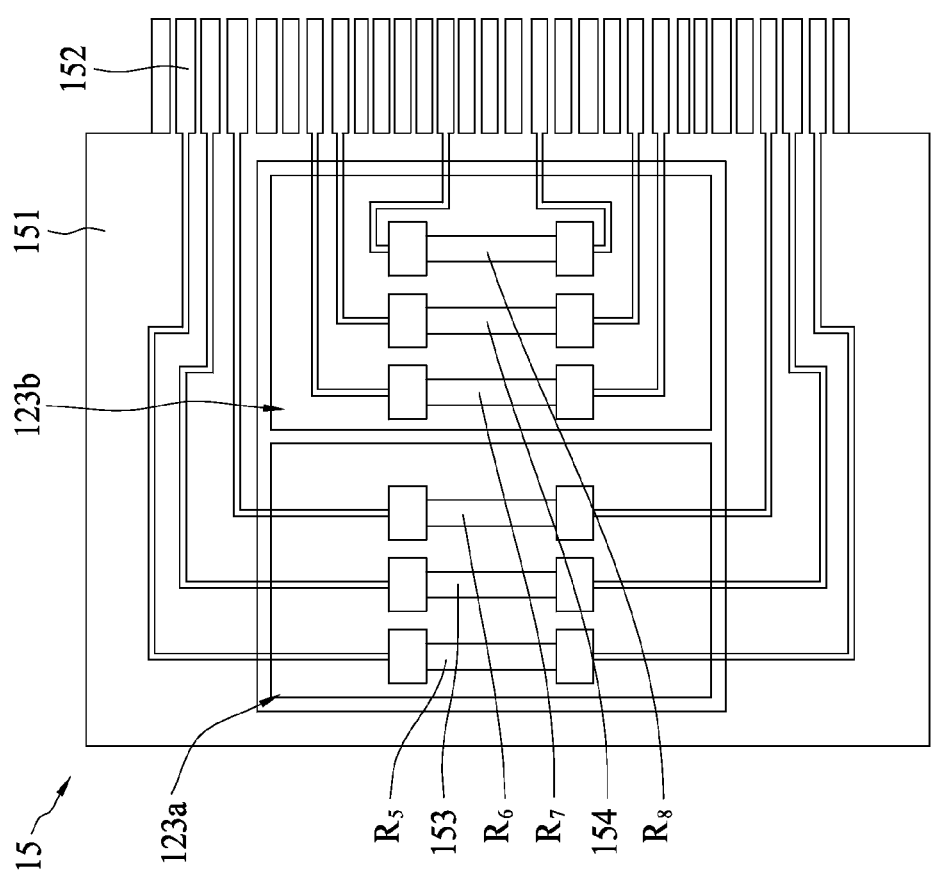
FIG. 7 shows a z-axis accelerometer according to one embodiment of the present invention.

FIG. 5 is an illustration showing a socket connector 135 disposed on an insulating substrate 129 according to one embodiment of the present invention. FIG. 6 schematically demonstrates a socket connector 135 according to one embodiment of the present invention. FIG. 7 demonstrates a z-axis accelerometer 15 according to one embodiment of the present invention. Referring to FIGS. 5 to 7, a socket connector 135 can be disposed on an insulating substrate 129 that extends on an X-Y plane. The socket connector 135 is configured to connect with a z-axis accelerometer 15, as shown in FIG. 7, and to receive z-axis acceleration signals generated from the z-axis accelerometer 15. When the z-axis-oriented insulating substrate 151 is accelerated along a direction perpendicular to the X-Y plane or parallel to the z-axis, the acceleration of the insulating substrate 129 on the X-Y plane along the z-axis can be measured.

Referring to FIG. 7, the z-axis accelerometer 15 comprises an insulating substrate 151, two z-axis acceleration-sensing devices 123a and 123b, and a plurality of contact pads 152. The insulating substrate 151 can be made of polythiophene (PT), polyethylene terephthalate (PET), or polyimide (PI). The two z-axis acceleration-sensing devices 123a and 123b are formed on the insulating substrate 151. The plurality of contact pads 152 are disposed adjacent to an edge of the insulating substrate 151. Each z-axis acceleration-sensing devices 123a or 123b comprises two temperature-sensing components ((R5 and R6) or (R7 and R8)) and a heater 153 or 154 disposed between the corresponding two temperature-sensing components ((R5 and R6) or (R7 and R8)). Two ends of each of the heaters (153 and 154) and the temperature-sensing components (R5, R6, R7 and R8) are respectively coupled with corresponding contact pads 152.

Referring to FIGS. 5 and 6, the socket connector 135 comprises an insulating body 1351 and a plurality of terminals 1352. The insulating body 1351 comprises a slot 1353, into which the z-axis accelerometer 15 can be inserted. The terminals 1352 can be disposed in the insulating body 1351, electrically connecting to the z-axis accelerometer 15 and the bus 130 on the insulating substrate 129 that extends on an X-Y plane.

Referring to FIGS. 5, 6, and 7, when the z-axis accelerometer 15 is inserted into the socket connector 135, one end of each of the temperature-sensing components ((R5 or R6) and (R7 or R8)) on different sides of the heaters (153 and 154) connects to a connecting point 222 or 223 on the insulating substrate 129 that extends on an X-Y plane via a corresponding contact pad 152 and terminal 1352 to form a Wheatstone bridge. The connecting point 222 or 223 is coupled with the amplifier 132 to amplify a signal that is generated due to the occurrence of the z-axis acceleration. The signal is adjusted by the chip 128 for gravity compensation. The control and amplification device 124 and the wireless module 125 then send out the magnitude of the z-axis acceleration to the monitoring apparatus 111 as in FIG. 1. Another end of each of the temperature-sensing components (R5, R6, R7 and R8) connects to the chip 128 through a corresponding contact pad 152 to receive electrical energy, which provides the temperature-sensing components (R5, R6, R7 and R8) for measuring accelerations.

An exemplary method for manufacturing a multiple-axis thermal convection-type accelerometer is disclosed below. Although the method illustratively demonstrates how an x-axis acceleration-sensing device 121a is manufactured, the method can also be applied to simultaneously manufacture a plurality of x-axis acceleration-sensing devices 121a and 121b, a plurality of y-axis acceleration-sensing devices 122a and 122b, and a plurality of z-axis acceleration-sensing devices 123a and 123b.

Figure 8:
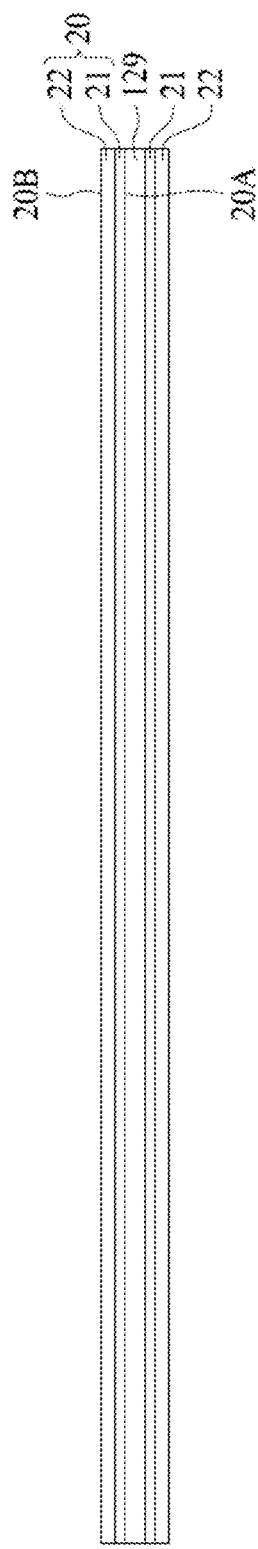
FIGS. 8 to 21 show the steps of a method for manufacturing a multiple-axis thermal convection-type accelerometer according to one embodiment of the present invention.

FIGS. 8 to 21 illustratively demonstrate the steps of a method for manufacturing a multiple-axis thermal convection-type accelerometer according to one embodiment of the present invention. Referring to FIG. 8, silicon dioxide layers 21 are vapor-deposited respectively on upper and lower surfaces of an insulating substrate 129 to cover the insulating substrate 129 for moisture prevention. Thereafter, two silicon nitride layers 22 are vapor-deposited respectively on the upper and lower surfaces, covering the silicon dioxide layers 21 for protecting the insulating substrate 129 from moisture and being damaged during the manufacturing processes. A supporting layer 20 has a first side 20A and a second side 20B opposite to the first side 20A.

Figure 9:
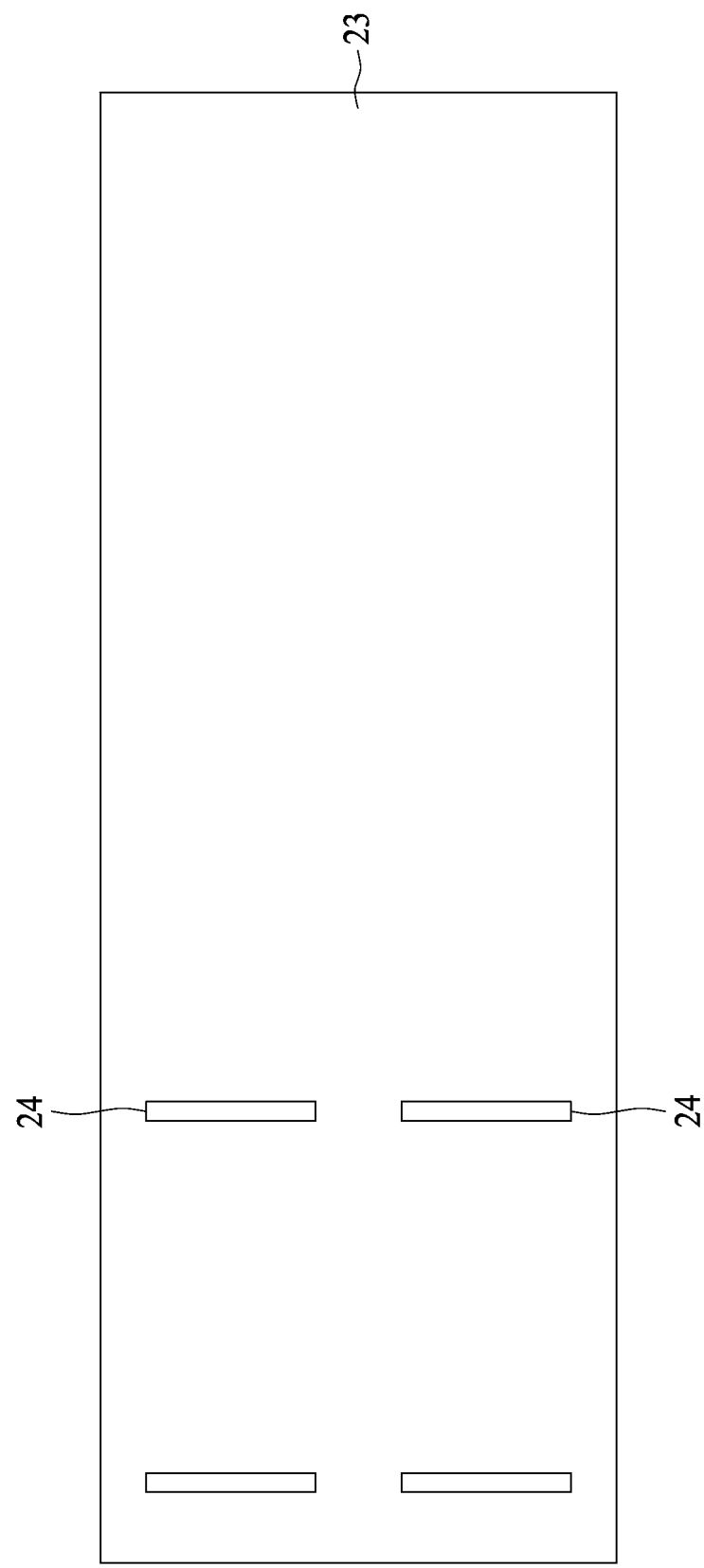
Figure 10:
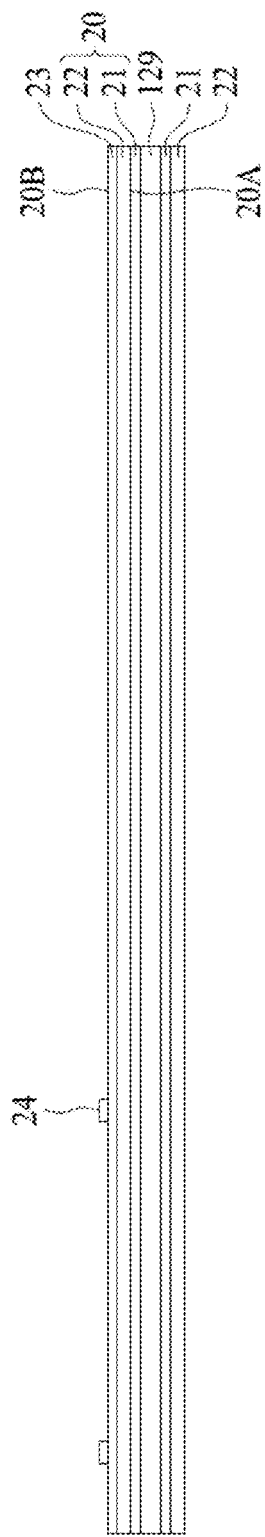

FIG. 9 demonstrates strip-shaped photo-resist structures to make p-type doped amorphous-silicon stripes as the temperature sensors according to one embodiment of the present invention. FIG. 10 is a cross-sectional view of the structures of FIG. 9. Referring to FIGS. 9 and 10, a powder mixture of a p-type impurity, such as boron and silicon, are vapor-deposited on a silicon nitride layer 22 using an electron beam gun to form a p-type doped amorphous silicon layer 23 on the silicon nitride layer 22. The p-type doped amorphous silicon layer 23 can be used for manufacturing thermistors. Thereafter, two groups, each of which comprises multiple strip-shaped photo-resistor structures 24, are formed on the p-type doped amorphous silicon layer 23 to protect and make the temperature-sensing components. In another embodiment, the strip-shaped structure can have a zigzag shape, which can increase resistance; preventing the generation of unnecessary heat that can cause an increase of temperature and affect the sensitivity of temperature-sensing components.

Figure 11:
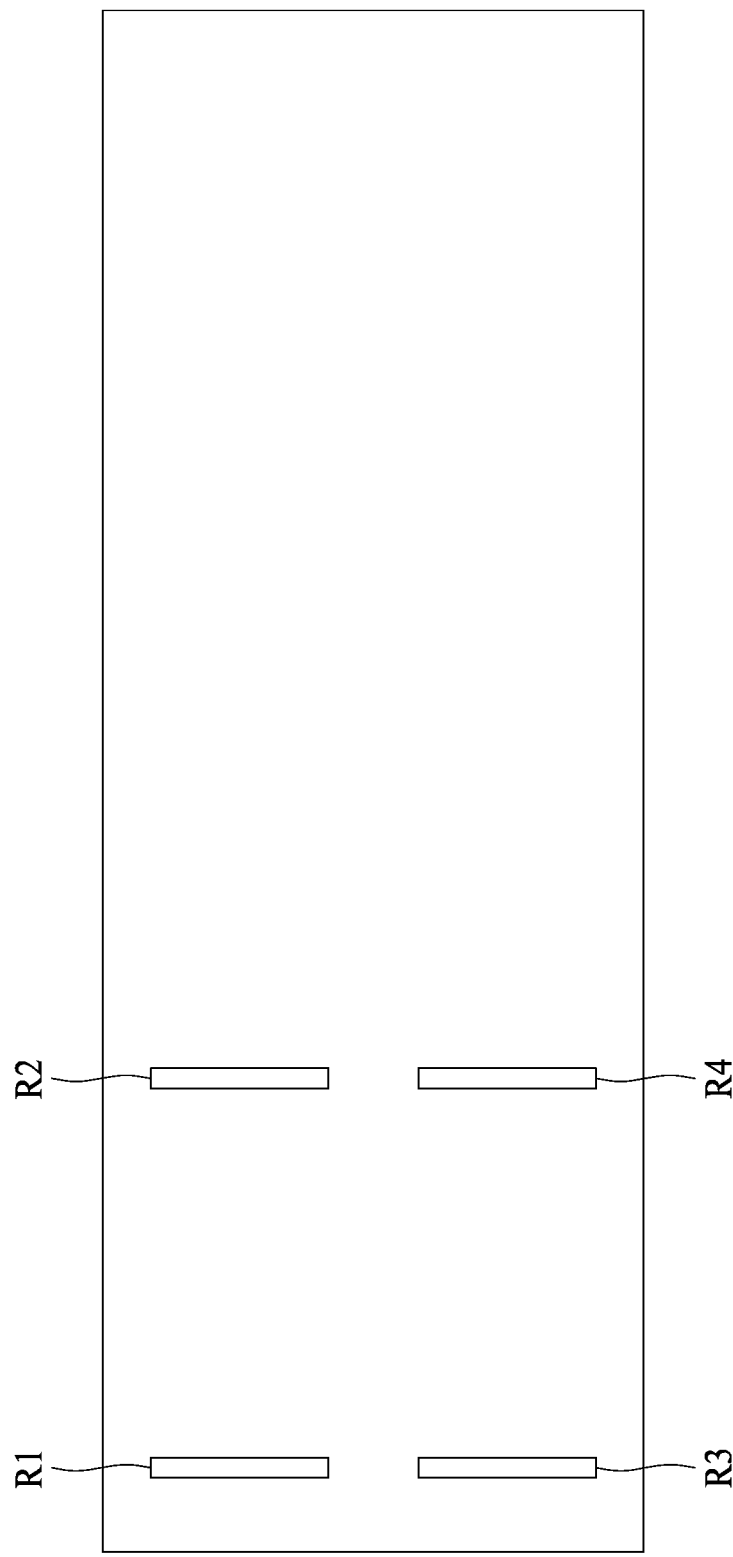
Figure 12:
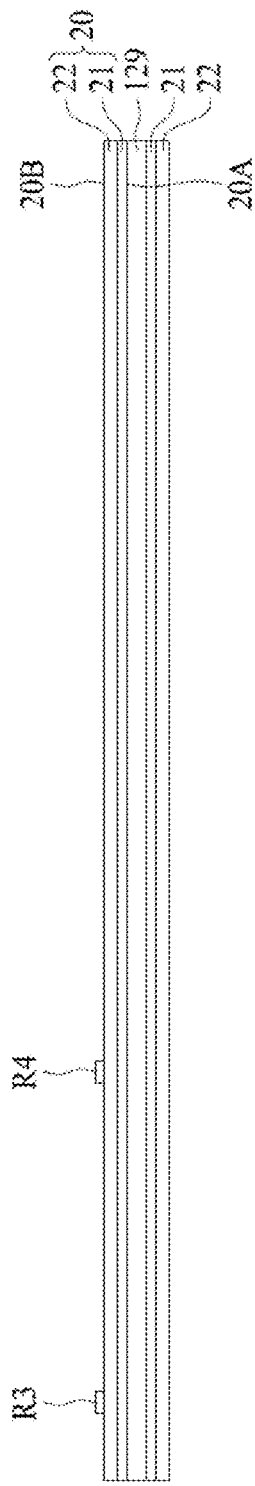

FIG. 11 is a top view showing temperature-sensing components (R1, R2, R3 and R4) according to one embodiment of the present invention. FIG. 12 is a cross-sectional view showing the structure of the embodiment of FIG. 11. Referring to FIGS. 11 and 12, an etchant solution such as KOH (potassium hydroxide) is applied to etch the p-type doped amorphous silicon layer 23 in order to obtain a plurality of stripe-shaped p-type doped amorphous silicon structures underneath the two groups of multiple stripe-shaped photo-resistor structures 24, which are used for forming the temperature-sensing components (R1, R2, R3 and R4). In one embodiment, the etchant solution can be a KOH (potassium hydroxide) solution. The KOH solution can be heated to a temperature between 60 and 80 degrees Celsius. Next, a wet-etch process is applied, using an organic solvent such as acetone, to remove the photo-resistor structures 24, or an ozone ashing process technology is applied to remove the photo-resistor structures 24. Thereafter, the p-type doped amorphous silicon structures are laser-annealed to p-type doped poly-silicon structures or layers 23, which are used as the material for forming thermistors and thin film resistors.

As shown in FIG. 12, the silicon dioxide layer 21 and the silicon nitride layer 22 comprise a supporting layer 20, wherein the supporting layer 20 is attached to the insulating substrate 129 and supports the temperature-sensing components (R1, R2, R3 and R4).

Figure 13:
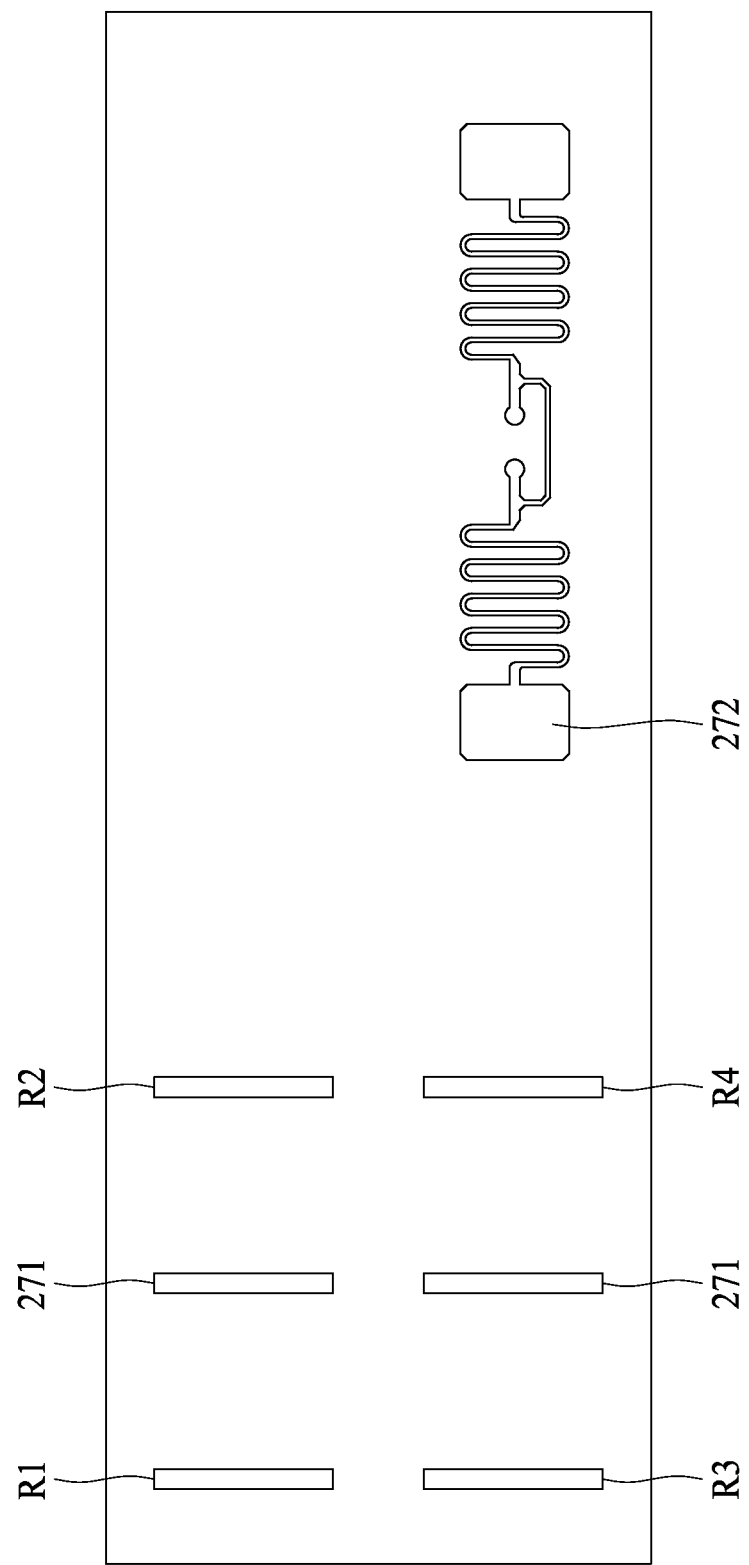
Figure 14:
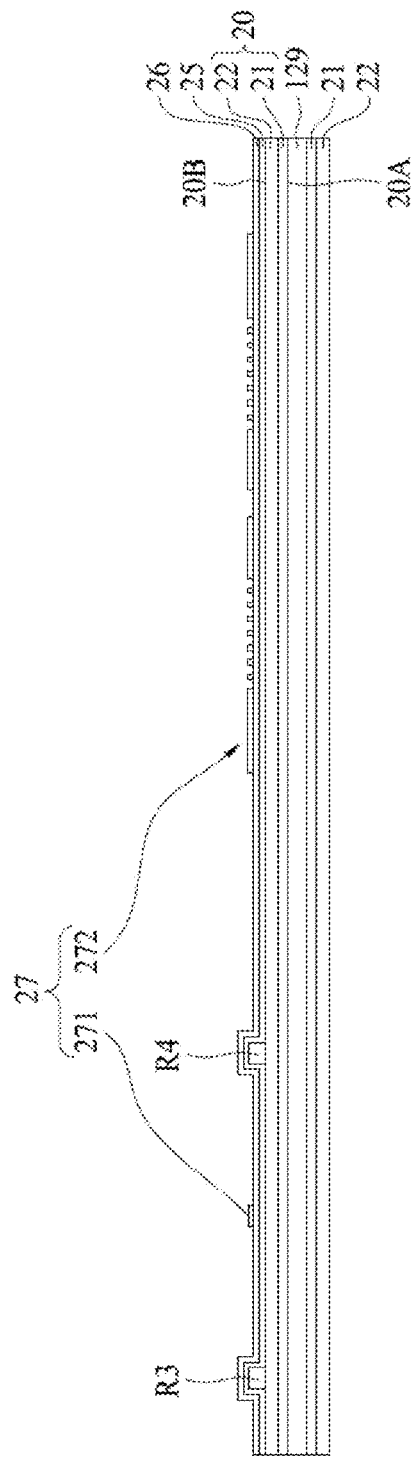

FIG. 13 is a top view showing a photo-resist pattern that forms a heater 133 or 134 as shown in FIGS. 2 and 3 and an antenna 126 for wireless transmission according to one embodiment of the present invention. FIG. 14 is a cross-sectional view of the embodiment of FIG. 13. Referring to FIGS. 2, 3 and 14, two metal layers are vapor-deposited by an electron beam gun, wherein one metal layer comprises a chromium layer 25, which has an effective adherence to the insulating substrate 129, and another metal layer comprises a nickel layer 26, which has an effective adherence to the chromium layer 25. The two metal layers are used for forming the heaters 133 and 134, the antenna 126 for wireless transmission, and circuits and buses 130 on the insulating substrate 129. Next, a patterned photo-resist layer 27 is formed on the nickel layer 26, wherein the patterned photo-resist layer 27 may comprise a pattern 271 that forms the heaters 133 and 134, a pattern 272 that forms the antenna 126 for wireless transmission, and a pattern (not shown) that forms the circuits and buses 130 on the insulating substrate 129. Thereafter, an etchant such as sulfuric acid is applied to etch the unprotected portions of the chromium layer 25 and the nickel layer 26. Furthermore, the patterned photo-resist layer 27 is removed using acetone, or by an ozone ashing process technology. Resultantly, as shown in FIG. 15, portions of the metal layer 33 that form the heaters 133 and 134, portions of the metal layer 34 that form the antenna 126 for wireless transmission, and portions of the metal layer that form the circuits and buses 130 on the insulating substrate 129 will remain.

Figure 15:
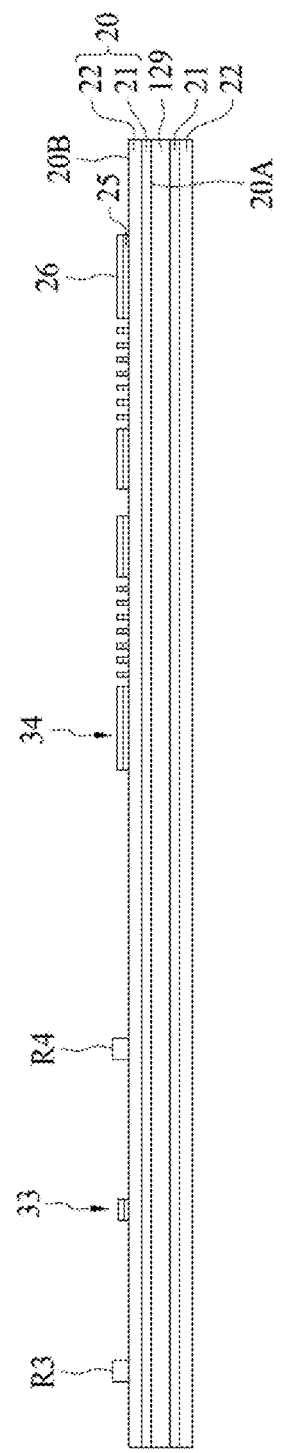

As shown in FIG. 15, in another embodiment, the portions of the metal layer 33 that form the heaters 133 and 134, portions of the metal layer 34 that form the antenna 126 for wireless transmission, and portions of the metal layer that form the circuits and buses 130 on the insulating substrate 129 can be obtained using a lift-off process for a MEMS application. The process deposits a thick photo-resist such as SU-8 after the completion of the temperature-sensing components (R1, R2, R3 and R4), and then patterns that form the heaters 133 and 134, the antenna 126 for wireless transmission, and the circuits and buses 130 on the insulating substrate 129 are defined. Thereafter, chromium and nickel are deposited. Next, a lift-off process for a MEMS application is applied to remove the following parts: photo-resist and the portions of the chromium and nickel layer attached onto the photo-resist, portions of the metal layer 33 that form the heaters 133 and 134, portions of the metal layer 34 that form the antenna 126 for wireless transmission, and portions of the metal layer that form the circuits and buses 130 on the insulating substrate 129 which remain.

Figure 16:
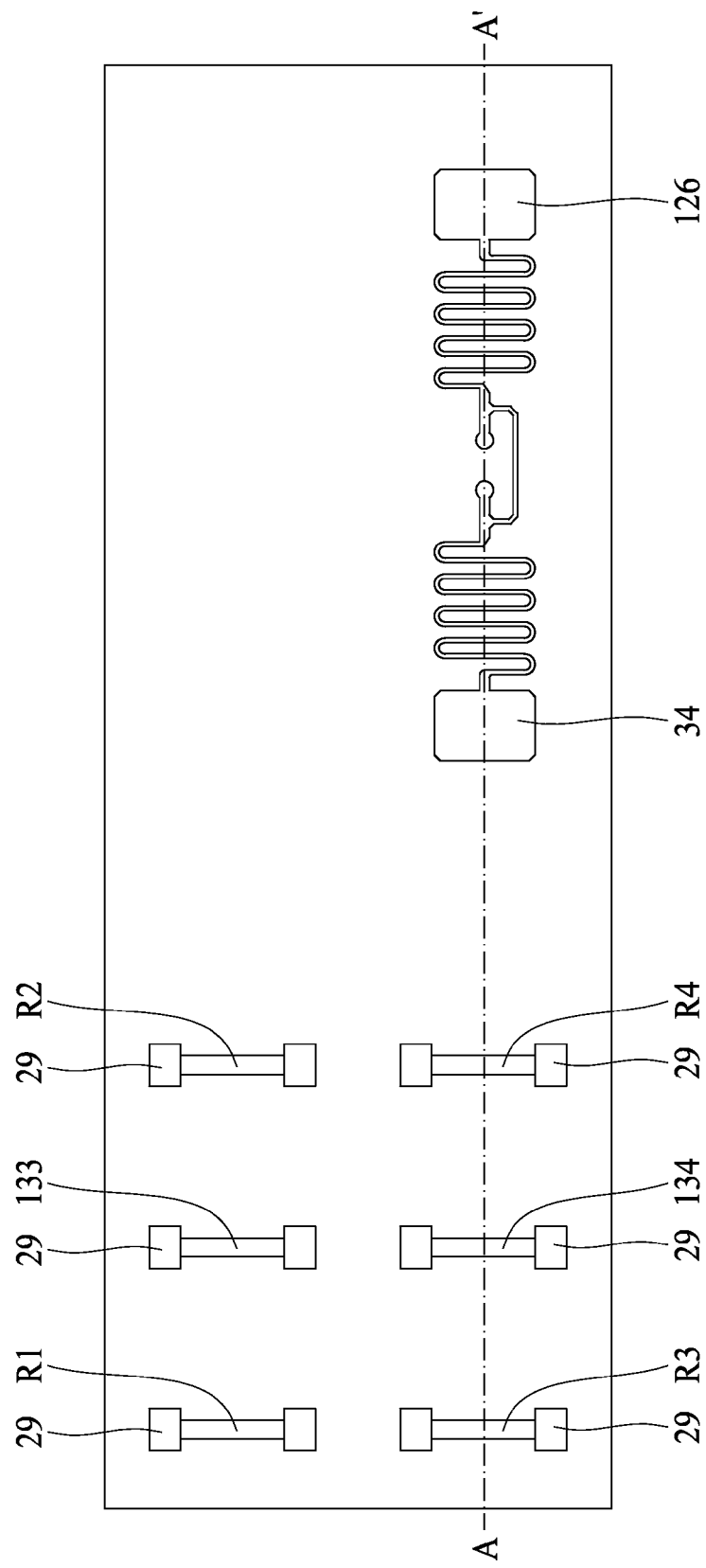
Figure 17:
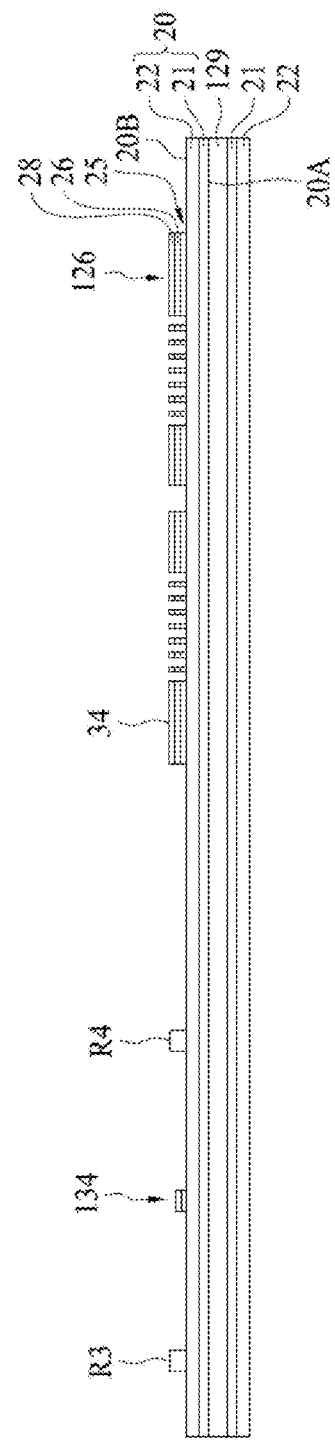

FIG. 16 is a top view showing the patterns of the heaters 133 and 134, and metal contact pads 29, which respectively connect with the ends of the heaters 133 and 134, the temperature-sensing components (R1, R2, R3 and R4), as well as the antenna 126 for wireless transmission according to one embodiment of the present invention. FIG. 17 is a cross-sectional view along line A-A' of FIG. 16. Referring to FIGS. 16 and 17, a patterned photo-resist layer is formed on the upper surface of the substrate, wherein the patterned photo-resist layer exposes the portions of the metal layer 34 that form the antenna 126, the portions of the metal layer that form the circuits and buses 130, the heaters 133 and 134, as well as the metal contact pads 29 connecting the ends of the heaters 133 and 134 and the temperature-sensing components (R1, R2, R3 and R4). Next, an electroless plating process is applied to deposit a gold layer 28 onto the locations that are not covered by the photo-resist layer. The reason for applying a gold layer 28 is due to the low resistance of gold layers and the effective adherence that gold layers provide to nickel layers. The performance of the antenna and the temperature-sensing components formed by using the electroless plating process is better than that of the antenna and the temperature-sensing components formed by using screen-printing technology or an electrolytic copper plating technology. Next, the patterned photo-resist layer can be removed by a wet-etch process using an organic solvent such as acetone or an ozone ashing process technology.

As shown in FIG. 17, the heaters (133 and 134) and the temperature-sensing components (R1, R2, R3 and R4) are all supported by the supporting layer 20 comprising the silicon dioxide layer 21 and the silicon nitride layer 22. The heaters (133 and 134) and the temperature-sensing components (R1, R2, R3 and R4) are not suspended over a grooved structure but directly adhered on the substrate protecting surface 20, which is one of the specific features of the present invention.

Figure 18:
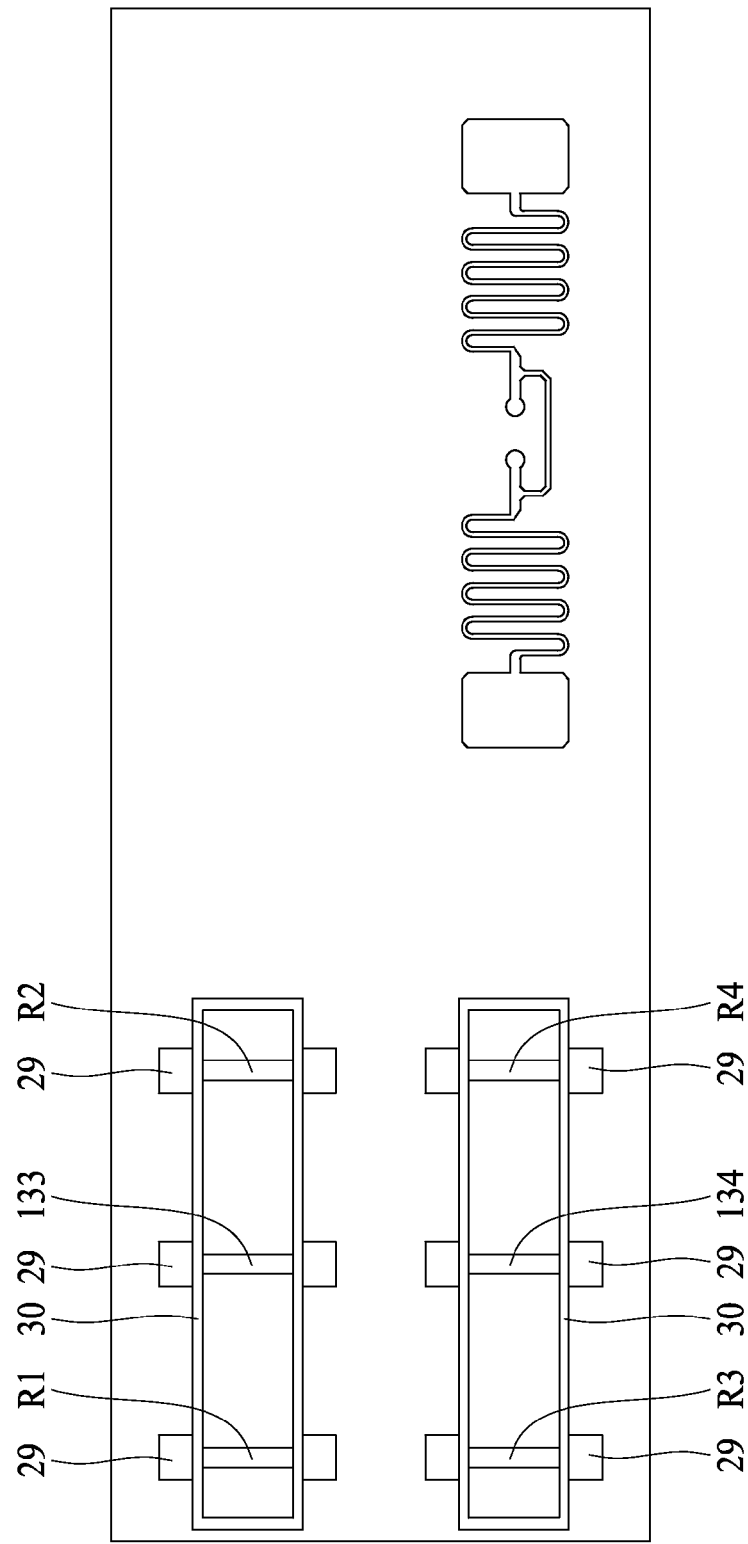

As shown in FIGS. 2, 17, and 18, the y-axis acceleration-sensing devices 122a or 122b and the x-axis acceleration-sensing devices 121a or 121b can all be formed on the same insulating substrate 129. As such, the heaters and the temperature-sensing components of the y-axis acceleration-sensing devices 122a or 122b are all supported by the same supporting layer 20. Alternatively, the y-axis acceleration-sensing devices can be formed on another supporting layer on the substrate such that the heaters and the temperature-sensing components are supported by that supporting layer 20 and not suspended over a grooved structure, wherein the supporting layer 20 comprises a silicon dioxide layer and a silicon nitride layer. In addition, the z-axis acceleration-sensing devices 123a and 123b in FIG. 7 can be manufactured using the above processes, and the heaters and the temperature-sensing components of the z-axis acceleration-sensing device 123a or 123b are all supported by a supporting layer and not suspended over a grooved structure, wherein the supporting layer comprises a silicon dioxide layer and a silicon nitride layer.

Referring to FIG. 18, an adhesive layer 30 is formed around the temperature-sensing components ((R1 and R2) or (R3 and R4)) and the heater 133 or 134 of each x-axis acceleration-sensing device 121a or 121b using a screen-printing technology to form a dam bar for sealing.

Figure 19:
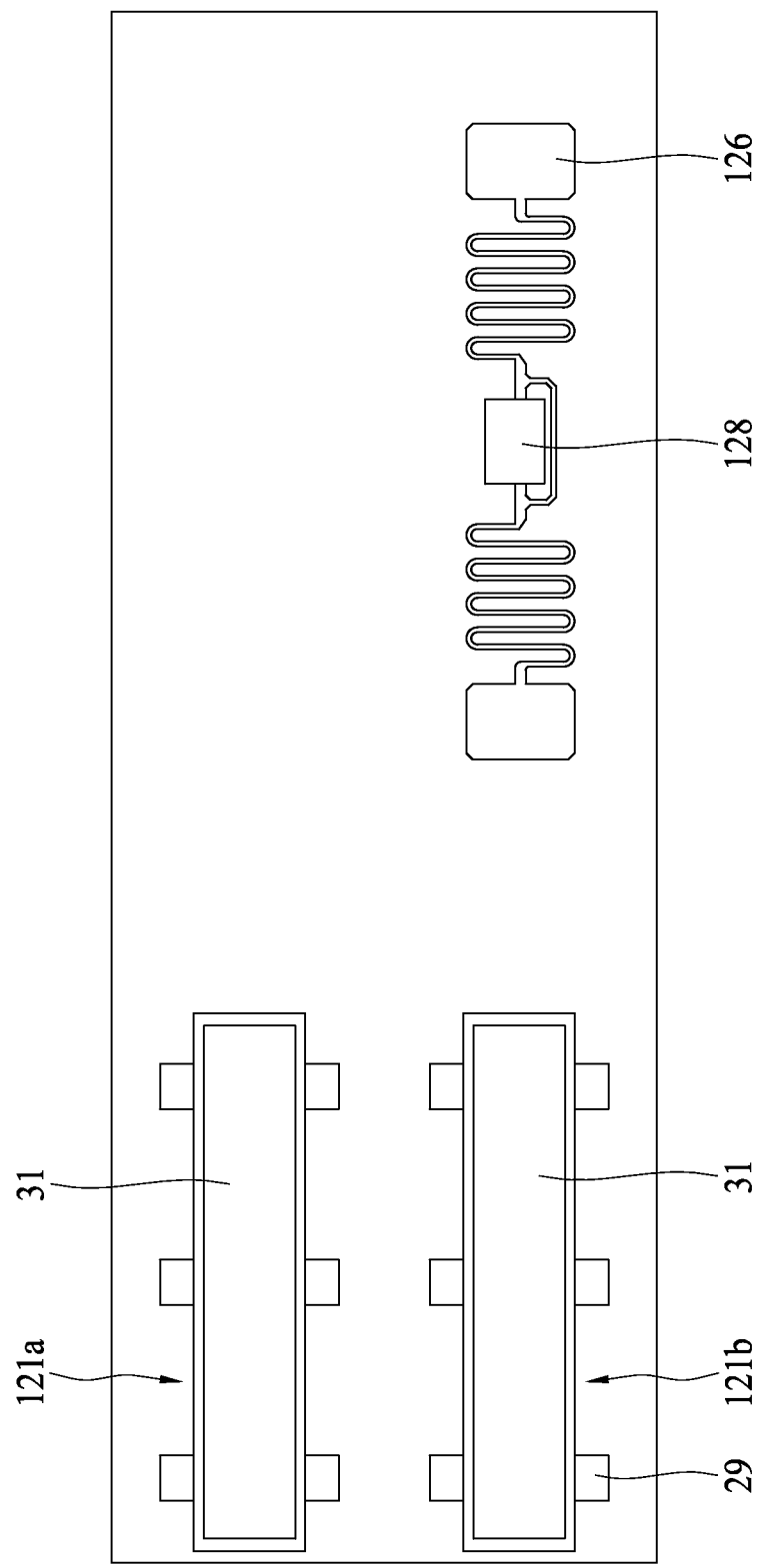
Figure 20:
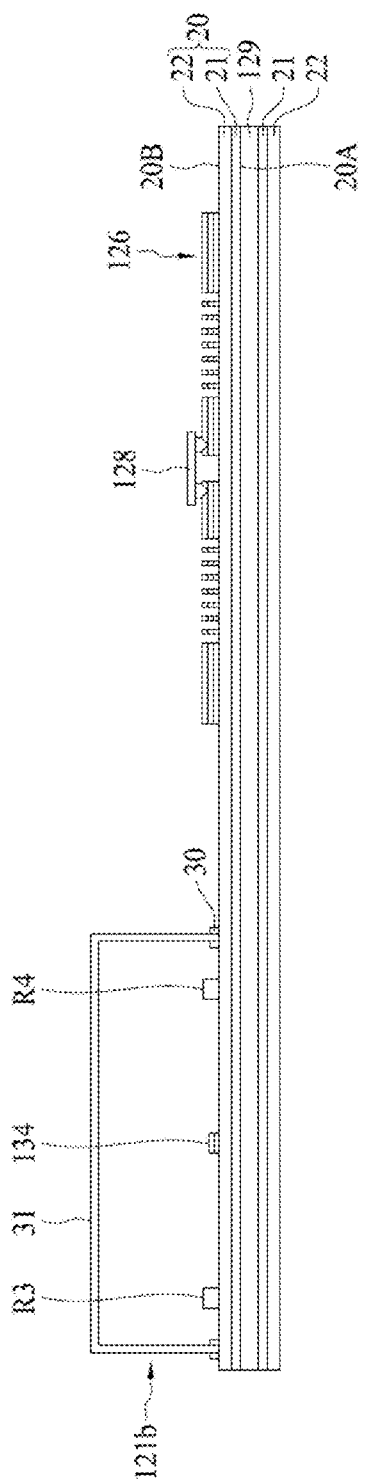

FIG. 19 is a top view showing an x-axis accelerometer comprising an x-axis acceleration-sensing device 121a or 121b and an antenna according to one embodiment of the present invention. FIG. 20 is a cross-sectional view of the embodiment of FIG. 19. Referring to FIGS. 19 and 20, a heat-insulated rectangular cover 31 is placed onto the adhesive layer 30, and the adhesive layer 30 is dried to seal the chamber. Next, the air inside the cover 31 is removed, and a noble gas with a high molecular weight that does not cause oxidation, such as argon, krypton or xenon, is filled to increase the sensitivity and reliability of the accelerometer. The insulating substrate 129 is attached to the first side 20A, and the acceleration-sensing device 121B is attached to the second side 20B.

Figure 21:
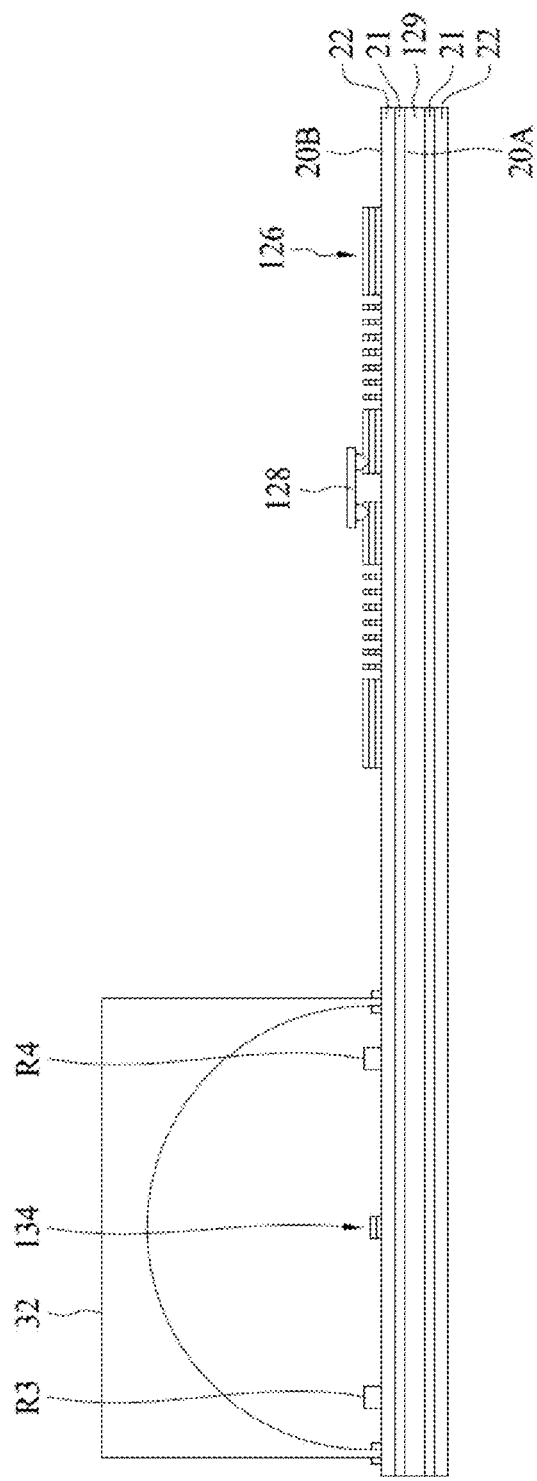

In another embodiment, as shown in FIG. 21, the inner chamber of the cover 32 can have a hemispherical or hemi-cylindrical shape, and a thermal convection in such an inner chamber can reach equilibrium more quickly after the accelerometer has stopped accelerating. Thus, the inner chamber will not have the problem in which acceleration facilitates the dissipation of heat from the thermal convection in a rectangular chamber into a larger space. Moreover, the inner chamber with a hemispherical or hemi-cylindrical shape has no dead space and will not cause any turbulent flow. As such, the inner chamber with a hemispherical or hemi-cylindrical shape, which is one of the specific features of the present invention, can increase response bandwidths, sensitivity, linearity, and the measurement range of acceleration of an accelerometer. The exterior shape of the cover 31 and 32 can be a rectangular one with a flat top surface, which can be used for printing the following product information: trademark, name, serial number, and production date.

In addition, bumps can be formed on the chip 128. The chip 128 can be flip-chip-bonded with the feed terminals of the antenna 126 such that the connections can be reduced in length and the signal receiving and transmitting performance of the antenna can be improved.

Referring to FIGS. 2, 5, and 6, the method for manufacturing a thermal convection-type accelerometer further comprises a step of attaching a socket connector 135 to the insulating substrate 129 after the completion of the circuits and buses 130. Ends of connector terminals 1352 contact corresponding contact pads 152 of the z-axis accelerometer 15, as shown in FIG. 7, and another ends of the connector terminals 1352 connect with the insulating substrate 129, electrically connecting the circuits and buses 130. The application of the socket connector is one of the specific features of the present invention. When the z-axis accelerometer 15 is operated, the measured results are compensated for gravity such that accurate acceleration magnitudes can be obtained.

Figure 22:
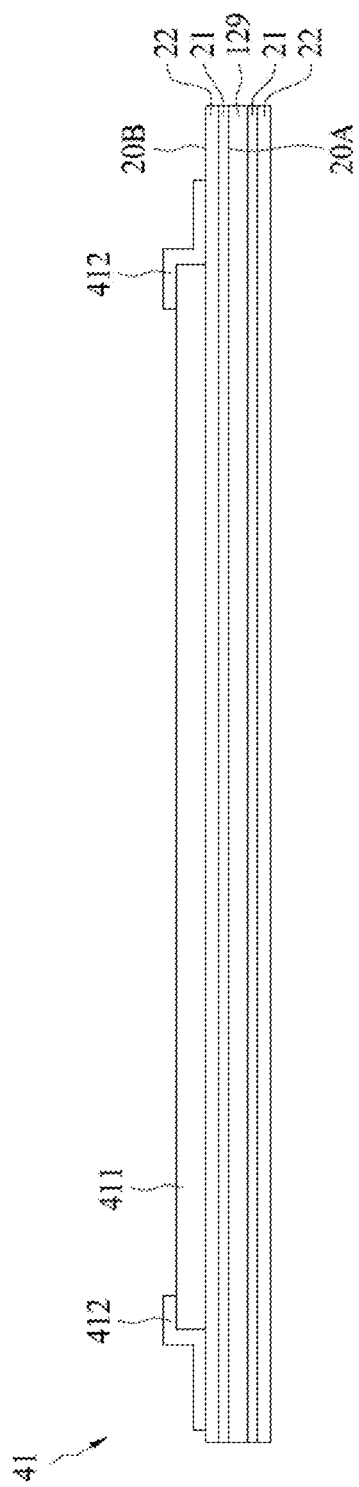
FIG. 22 is a cross-sectional view showing a thin film resistor according one embodiment of the present invention.

FIG. 22 shows the cross-section of a thin film resistor 41 as shown in FIGS. 2 and 3. The thin film resistor 41 comprises a resistance layer 411 and two solder pads 412 for external connections, wherein the two solder pads 412 can be disposed on opposite sides of the resistance layer 411. The resistance layer 411 can be of a linear or a zigzag shape. The resistance layer 411 may comprise p-type poly-silicon and the solder pad 412 may comprise a gold layer. The thin film resistor 41 can be manufactured similarly to the temperature-sensing component (R1, R2, R3 or R4). Therefore, the manufacturing method is not repeated in this section. A plurality of resistors 41 can be formed, and some of them can be used as resistors that are required by the instrumentation amplifier 132.

Figure 23:
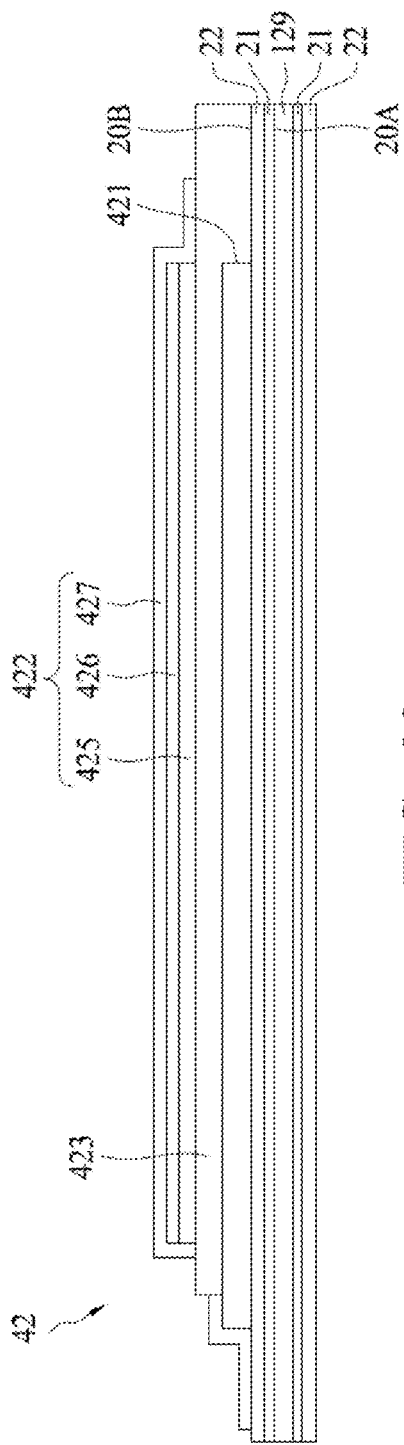
FIG. 23 is a cross-sectional view showing a thin film capacitor according to one embodiment of the present invention.

FIG. 23 shows the cross-section of a thin film capacitor 42 as shown in FIGS. 2 and 3 according to one embodiment of the present invention. The thin film capacitor 42 may comprise a lower electrode layer 421, an upper electrode layer 422, and an insulating layer 423. The upper electrode layer 422 comprises a chromium layer 425, a nickel layer 426, and a gold layer 427. The lower electrode layer 421 comprises a p-type doped poly-silicon. The insulating layer 423 comprises silicon nitride or can be formed with other insulating materials with larger permittivity to reduce the area of the thin film capacitor 42.

The above temperature-sensing components and heaters can be formed with a structure similar to that of a thermocouple or thermal pile.

Figure 24A:
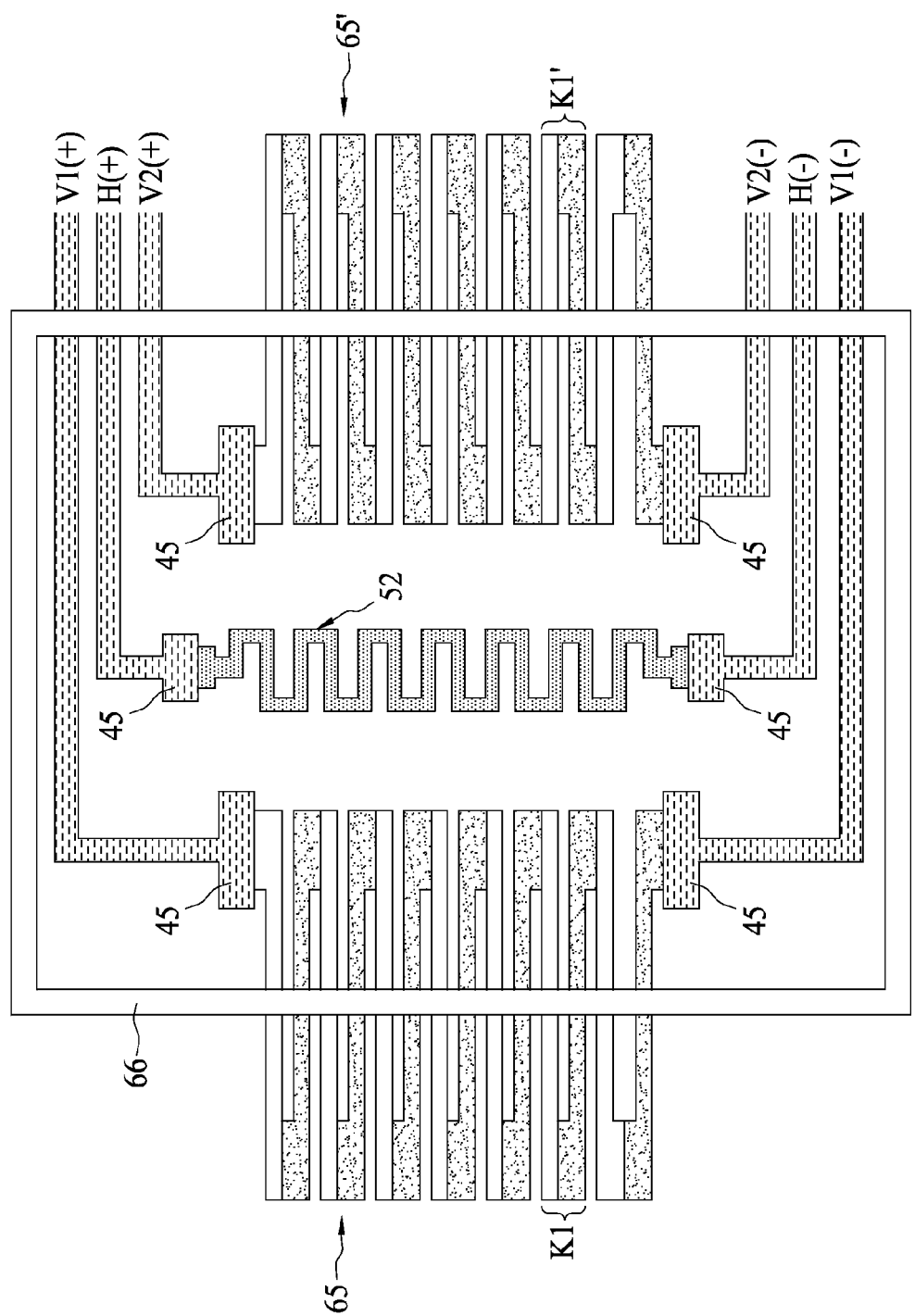
FIG. 24A shows heaters and thermal piles as temperature-sensing components as well as dam bars for sealing according to another embodiment of the present invention.

FIG. 24A is a view showing heaters and temperature-sensing components according to another embodiment of the present invention. Each temperature-sensing component 65 or 65' can be a Type K, E, T, or J thermal pile with two ends coated by gold layers. The temperature-sensing components 65 or 65' can comprise a plurality of groups, each of which comprises series-connected Type K thermocouple (K1) and Type K thermocouples (K1'). Each of Type K thermocouple (K1) and Type K thermocouple (K1') comprises a positive electrode made of Chromel, which comprises nickel and chromium, and a negative electrode made of Alumel, which comprises nickel, aluminum, magnesium and silicon. The method for forming the temperature-sensing components 65 and 65' and the heater 52 are detailed below.

Figure 24B:
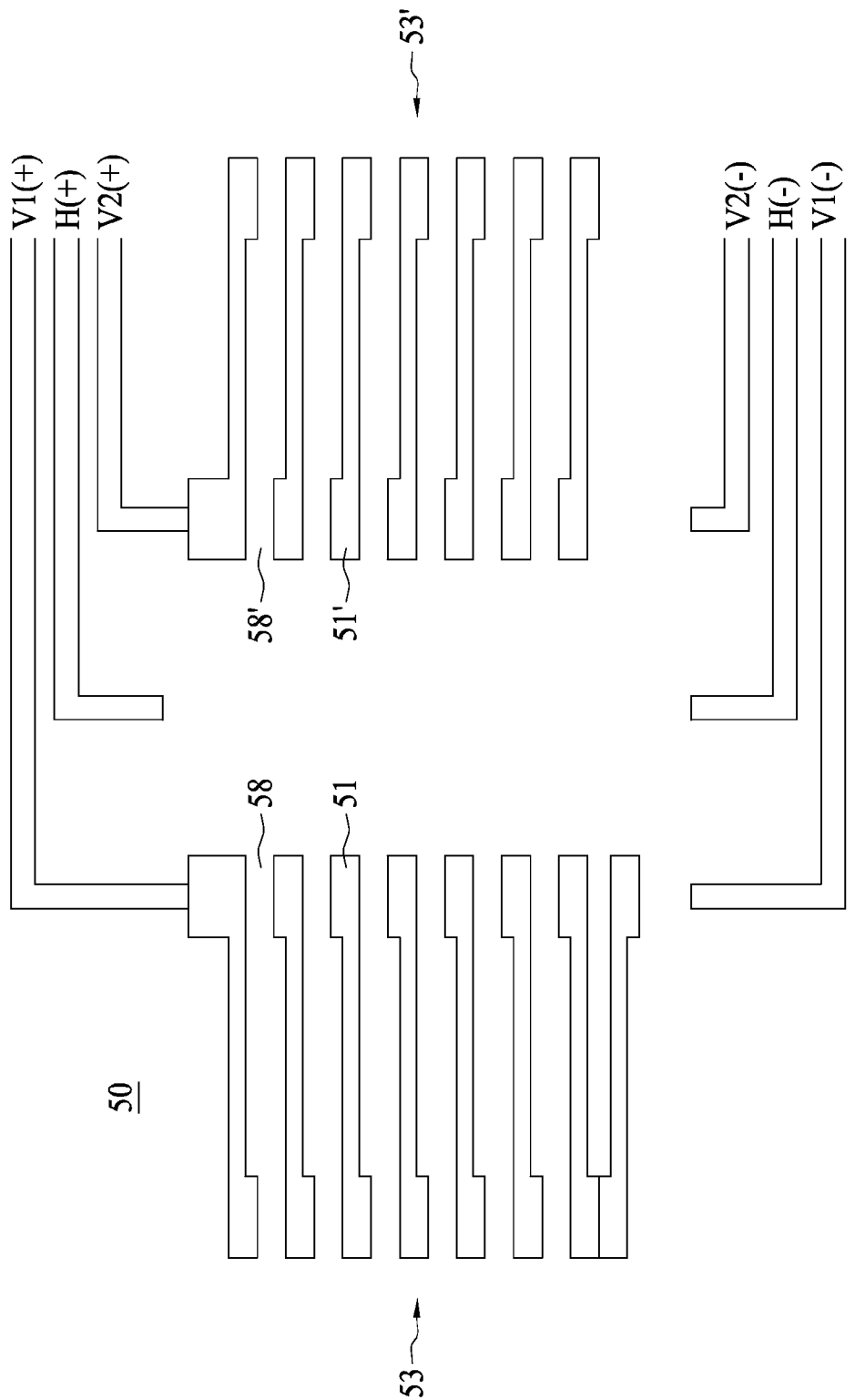
FIG. 24B shows a mask pattern for forming heaters and the Chromel electrodes of temperature-sensing components (Type K thermocouples) according to one embodiment of the present invention.
Figure 24C:
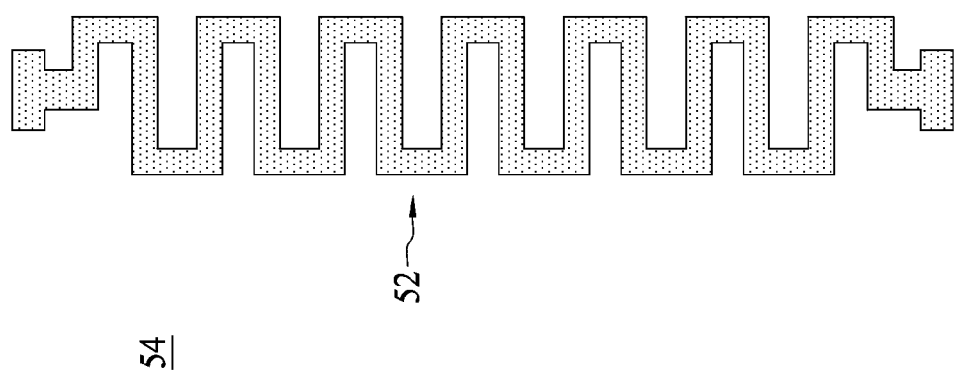
FIG. 24C shows another mask pattern for forming heaters according to one embodiment of the present invention.
Figure 24D:
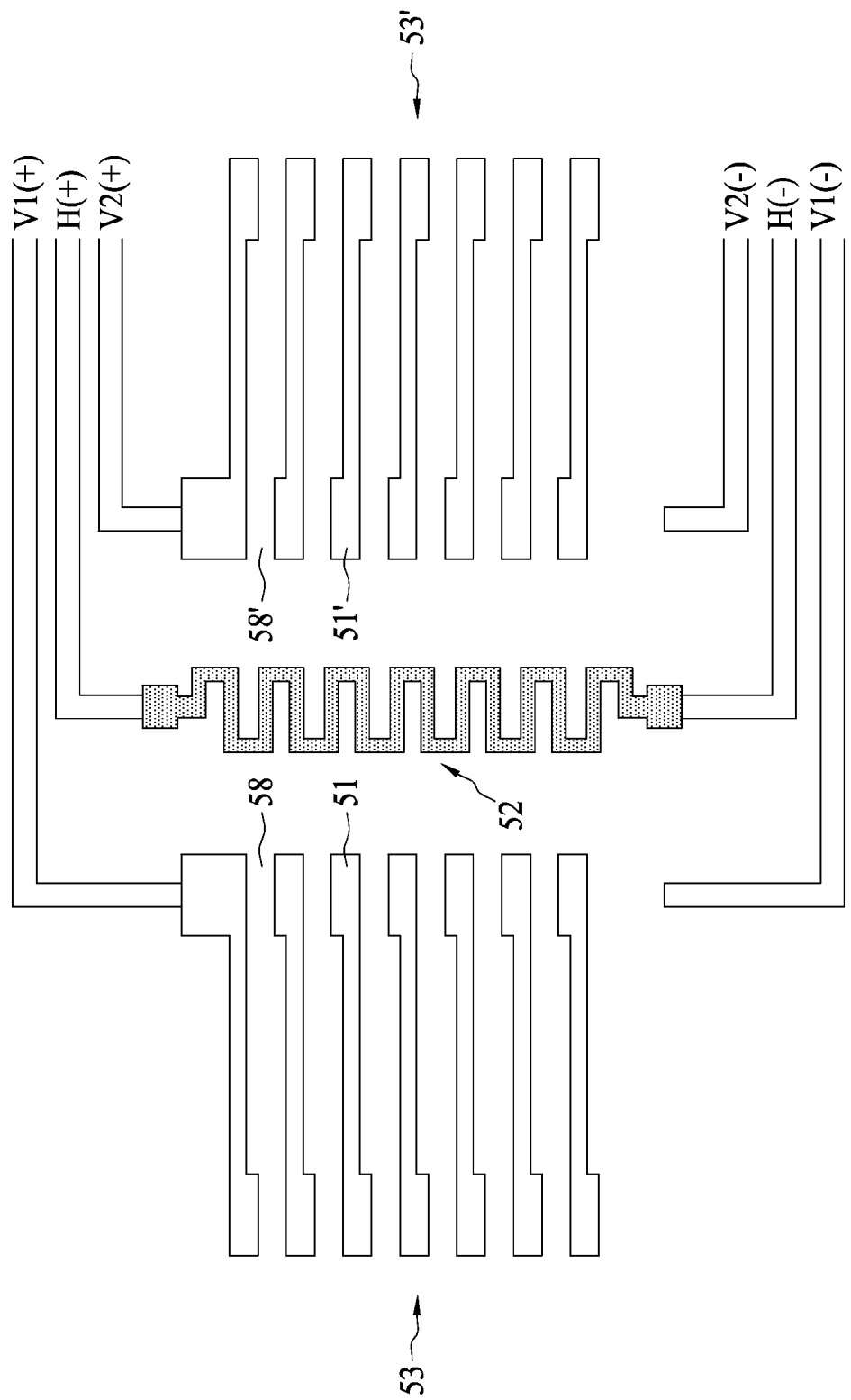
FIG. 24D shows a heater and the nickel-chromium positive electrodes of temperature-sensing components (Type K thermocouples) whose end portions are not coated with gold according to one embodiment of the present invention.

Referring to FIGS. 24B to 24D, the alloy for forming positive electrodes of Type K thermal piles are formed on the embodiment of FIG. 8. Firstly, preparing a metal target formed by mixing the chromium and nickel powders, the ratio of which is properly adjusted; then vapor-depositing a layer of chromium-nickel alloy by an electron beam gun. The vapor-deposited chromium-nickel alloy thin film comprises 90 to 91 weight percent of chromium and 9 to 10 weight percent of nickel. Next, a mask 50 as shown in FIG. 24B is applied to pattern a photo-resist layer by a lithographic process. The chromium-nickel alloy thin films unprotected by the photo-resist are etched away, and the remnant portions are the positive electrodes of Type K thermocouples. The patterns (53 and 53') used for thermocouples can be separated into a plurality of block patterns (51 and 51') by gaps (58 and 58'). The mask 50 is applied to obtain a plurality of chromium-nickel alloy blocks.

The fabrication process of the heater is shown in FIG. 24C. Firstly, preparing a metal target formed with a mixture of nickel and chromium powders, the ratio of which is properly adjusted, then a layer of nickel-chromium is vapor-deposited on the embodiment shown in FIG. 24B by an electron beam gun. The deposited alloy thin film comprises 12 to 19 weight percent of chromium and 81 to 88 weight percent of nickel. Next, a mask 54, as shown in FIG. 24C, for forming heaters is applied to pattern a photo-resist layer by a lithographic process, and the portions of the nickel-chromium alloy layers unprotected by the photo-resist are etched away. The remnant patterned portions of the layer comprise heaters 52 are as shown in FIG. 24D.

Figure 24E:
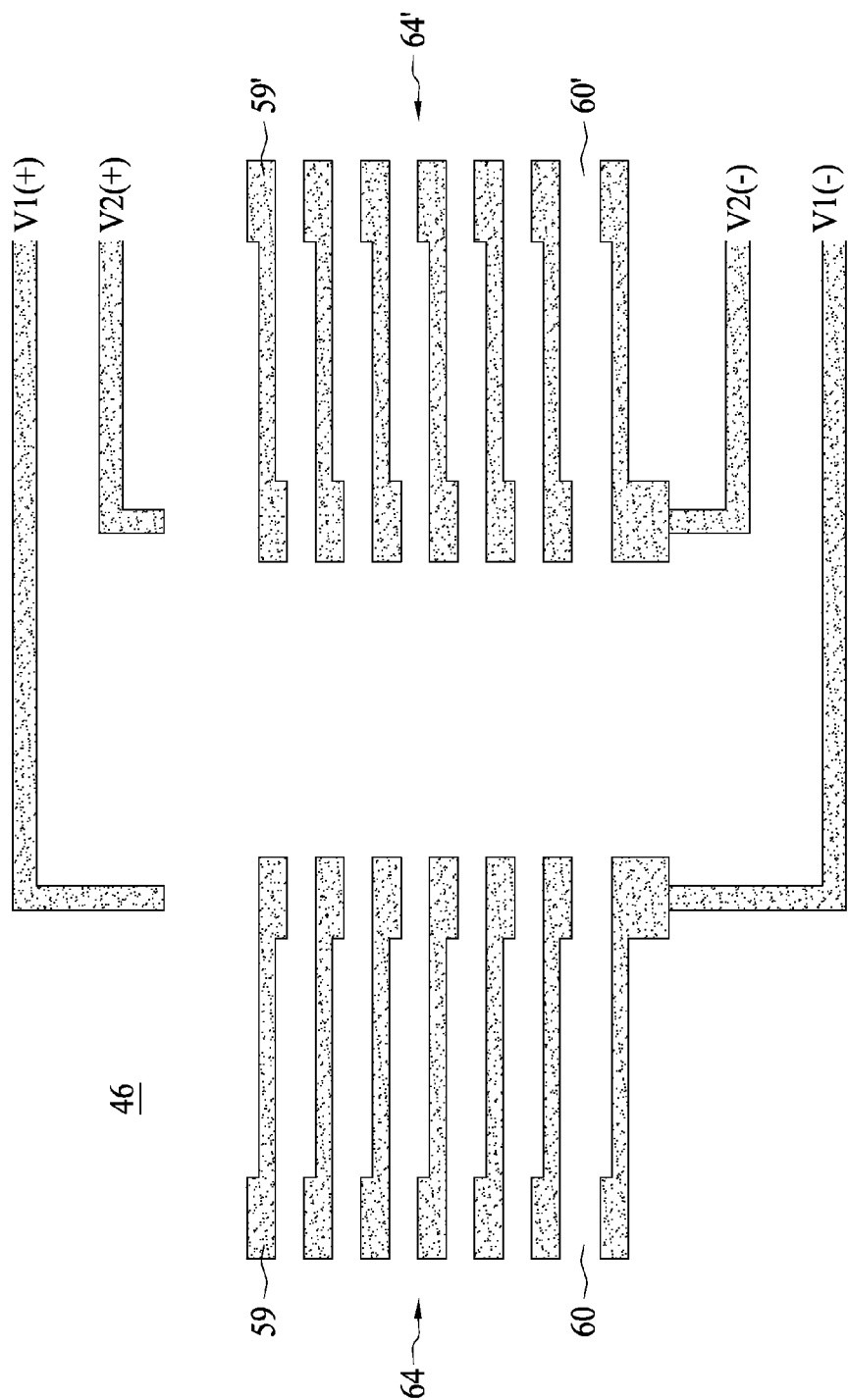
FIG. 24E shows another mask pattern for forming the negative electrodes (Alumel) of a Type K thermocouple according to one embodiment of the present invention.

Thereafter, the alloy for forming negative electrodes of Type K thermal piles is formed. Firstly, preparing a metal target formed with a mixture of nickel, aluminum, magnesium, and silicon powders, the ratio of which is properly adjusted. Then an alloy layer of nickel-aluminum-magnesium-silicon is vapor-deposited by e-gun. The vapor-deposited alloy thin film comprises 16 to 17 weight percent of nickel, 33 to 34 weight percent of aluminum, 33 to 34 weight percent of magnesium, and 16 to 17 weight percent of silicon. A mask 46 with patterns (64 and 64'), as shown in FIG. 24E, is applied to pattern the alloy thin film composed of nickel, aluminum, magnesium and silicon to form a plurality of alloy blocks, which are used as the negative electrodes of Type K thermocouples.

Figure 24F:
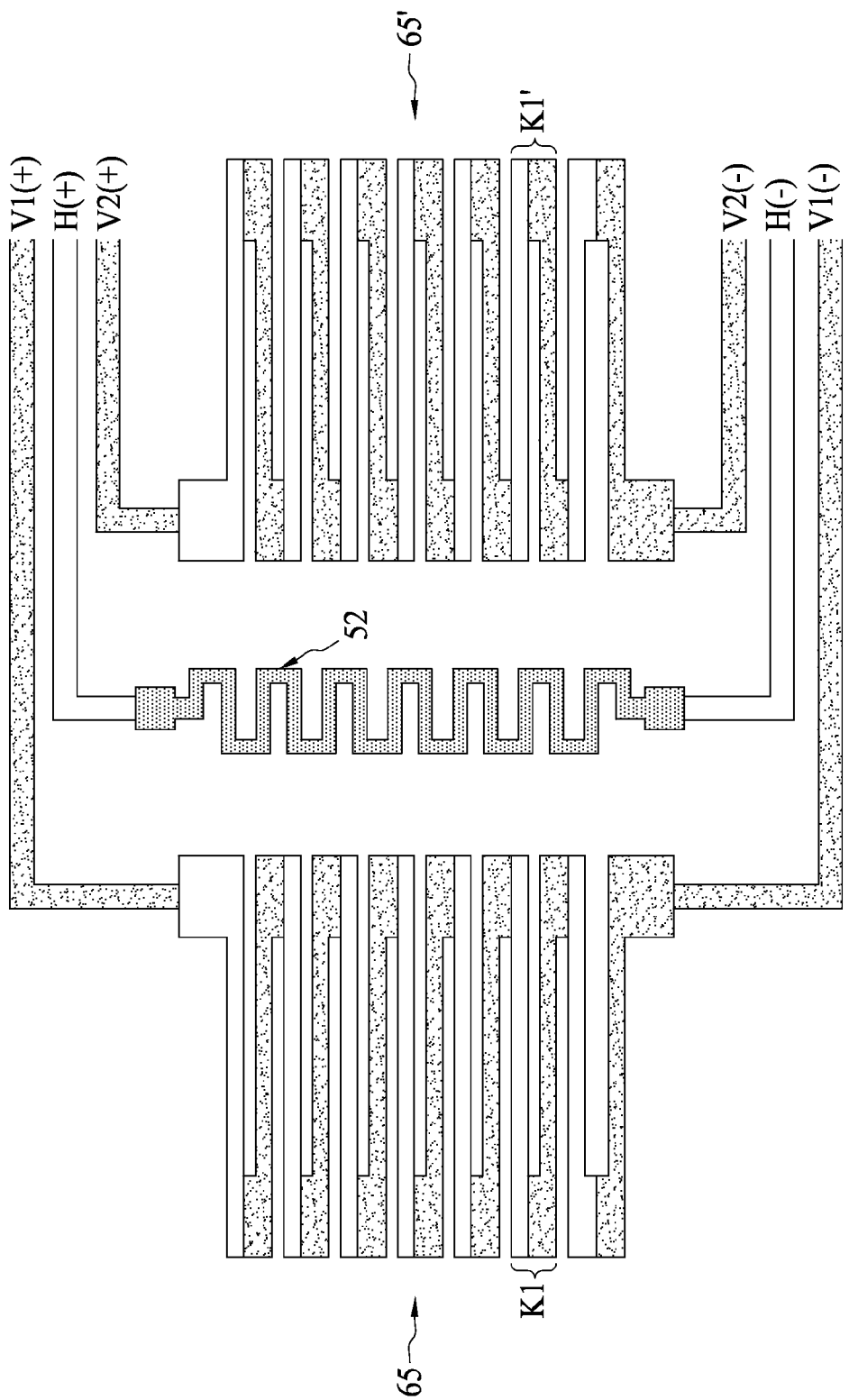
FIG. 24F shows the layout of heaters, Type K thermocouples and circuits according to one embodiment of the present invention.

The mask 46 is applied for forming patterns (64 and 64') used as the negative electrodes of Type K thermocouples. The patterns (64 and 64') comprises a plurality of block patterns (59 and 59') separated by gaps (60 and 60'). With the mask 46, a plurality of patterns (64 and 64') comprising nickel, aluminum, magnesium and silicon can be formed. The final Type K thermal piles are shown in FIG. 24F.

In one embodiment related to heaters, the performances of heaters can be improved by modifying the shape, width, number and density (depending on the resolution capability of the lithographic system) of the patterns for the heaters. In one embodiment related to a thermocouple, the performances and sensitivities of the series-connected thermal piles 65 and 65' can be improved by adjusting the gaps (58 and 58') separating the block patterns (53 and 53') (as shown in FIGS. 24B and 24D) and the gaps (60 and 60') separating the block patterns (59 and 59') (as shown in FIG. 24E) for thermocouples (K1 and K1'), and adjusting the shape, width, number and density (depending on the resolution capability of the lithographic system) of the temperature-sensing components.

Figure 24G:
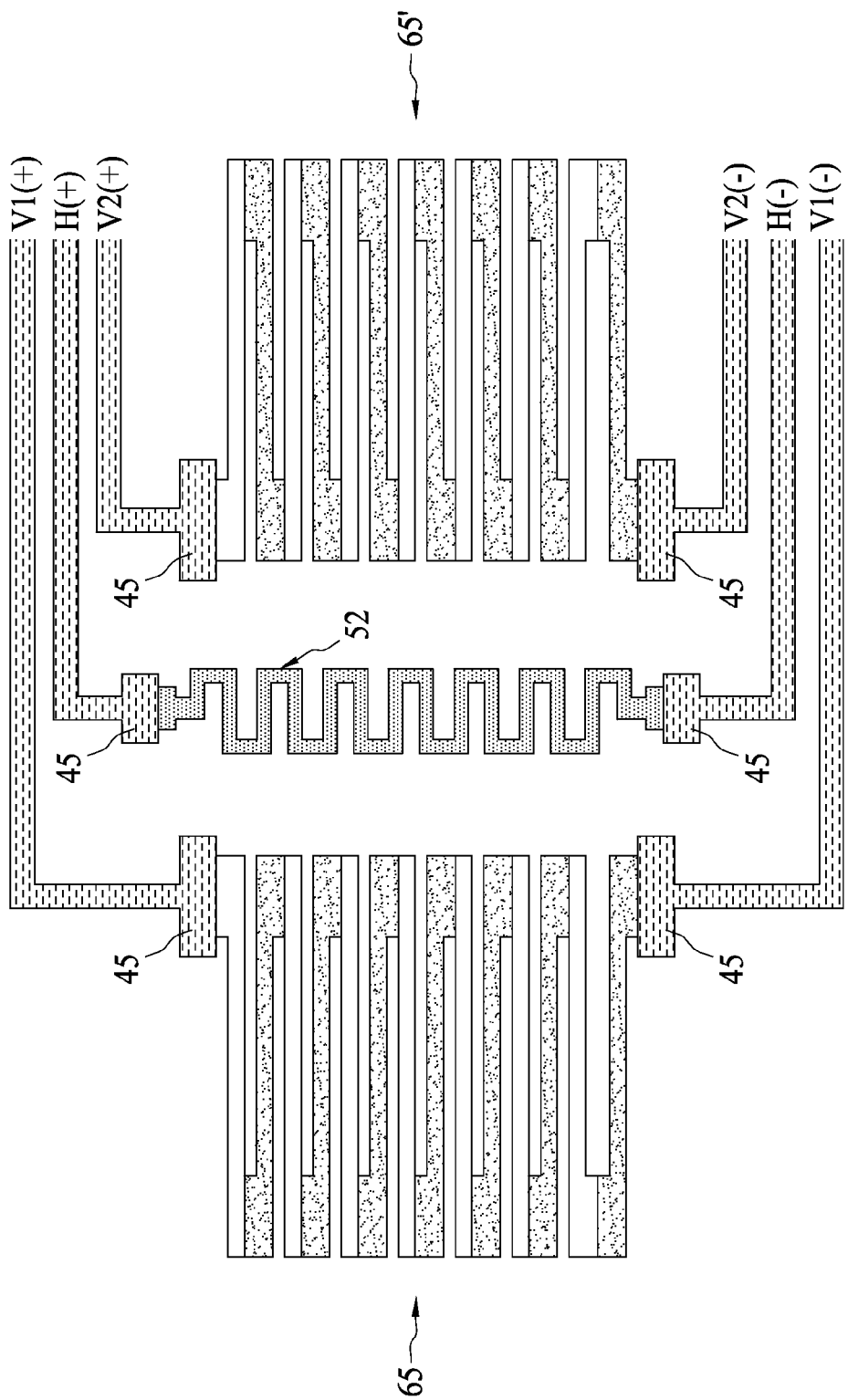
FIG. 24G shows gold layers formed on the two end portions of the heaters and the temperature-sensing components (Type K thermal piles)

A gold layer is formed in the following step. As shown in FIG. 24G, a photo-resist layer is formed and then dried. Using a lithographic process, the end portions of the heaters 52, the two temperature-sensing components 65 and 65', and other portions that are desired to be coated with gold are exposed. Next, the semi-product is placed in a gold-plating solution. A gold layer 45, which is an effective conductor, is electroless plated on the end portions of the heaters 52, the two temperature-sensing components 65 and 65', and the other portions that are desired to be coated with gold. As such, circuits that comprise chromium, nickel, aluminum or gold can be properly attached to the insulating substrate and may provide effective conductivity.

An adhesive layer 66 such as an epoxy resin is formed around the heater 52 and halves of the temperature-sensing components 65 and 65' as a dam bar. A hemi-cylindrical cover, as shown in FIG. 24A, is then placed on the adhesive layer 66 for sealing. The adhesive layer 66 is then dried out to fasten the cover. Air in the cover is then removed, and a noble gas such as argon, krypton or xenon is subsequently filled in, and the accelerometer fabrication process is then completed.

The purpose for only sealing the halves of the temperature-sensing components 65 and 65' (Type K thermal piles) is to make each thermocouple with two portions exposed to a cold region and a hot region, respectively. The portions in the cold region are used for environmental temperature compensation. The voltage generated from each of the series-connected thermocouples can be added up so that a larger output voltage can be obtained, thus the sensitivity for sensing the temperature can be increased, and the influence of the environmental temperature on the accelerometers can be minimized. In conventional accelerometers, the temperature compensation circuits are formed at locations inside the covers, where temperatures are the lowest. The temperature distribution may be changed when the accelerometers are accelerated; therefore, the acceleration measurement accuracy is reduced. Only sealing the halves of the temperature-sensing components inside a cover is also one of the specific features of the present invention. The accelerometer of the present disclosure has a portion of a temperature-sensing component outside of the cover, which can be used as the environmental temperature compensator. Besides, the heaters and the temperature-sensing components of the accelerometers are not suspended in the chamber. As such, the accelerometers can detect a wide range of accelerations and have broader applications including applications for air bags.

Figure 24H:
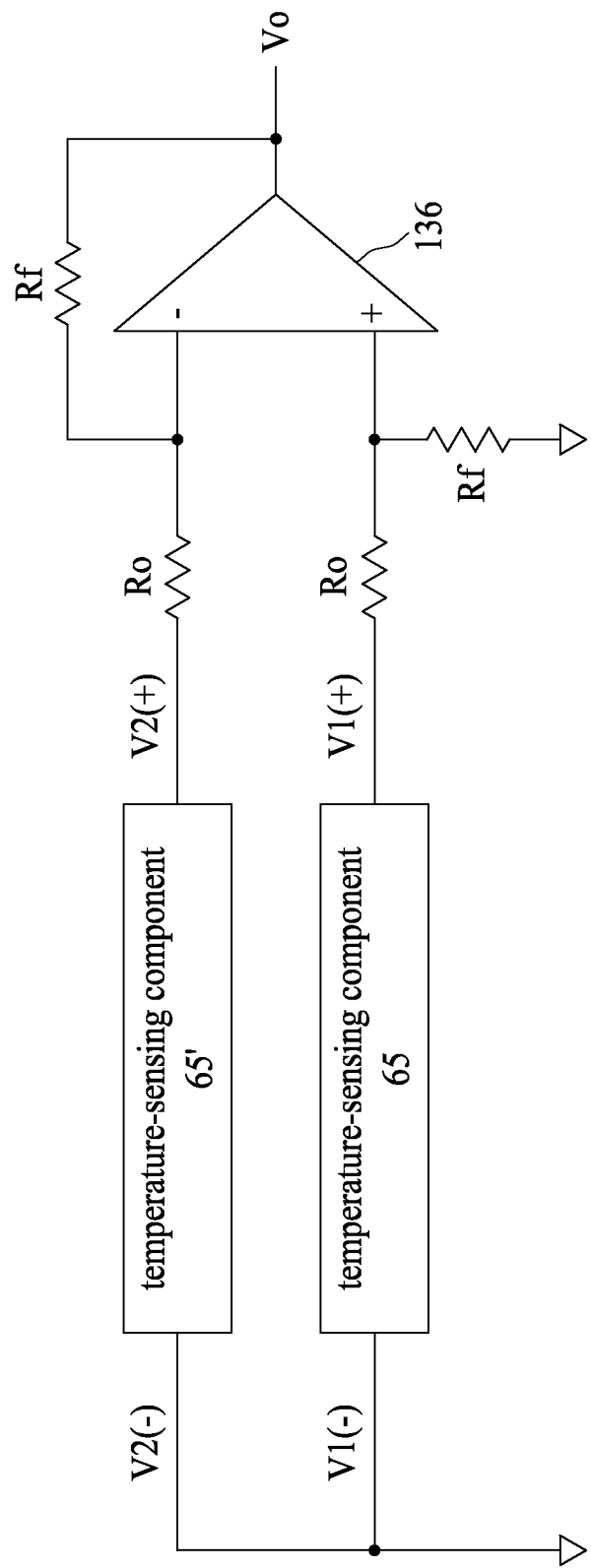
FIG. 24H shows the circuit using two temperature-sensing components and a subtractor for temperature compensation according to one embodiment of the present invention.

In another embodiment, as shown in FIG. 24H, the outputs of the Type K thermal piles 65 and 65' may connect to the control and amplification device 124 as shown in FIGS. 1 and 24H. The control and amplification device 124 may comprise a subtractor 136, and the temperature-sensing components 65 and 65' may connect to positive and negative inputs of the subtractor 136 via the circuits (formed by chromium, nickel, aluminum and gold) and a resistor R0. Such a connection may reduce geometric errors that are generated when the layout of the thermal piles are constructed and reduce the common-mode interference. The temperature differences created by accelerations can be precisely obtained and accurate voltages can be generated afterward.

In another embodiment, the temperature-sensing components 65 and 65' respectively at two sides of heaters may directly connect to an instrumentation amplifier inside the control and amplification device 124 via the circuits (formed by chromium, nickel, aluminum and gold). The instrumentation amplifier has large input impedance, resulting in good performance. In another embodiment, the connection of the temperature-sensing components 65 and 65' to the instrumentation amplifier can reduce geometric errors that are generated when the layout of the thermal piles are constructed and reduce the common-mode interference.

The present invention provides another method that includes processes similar to those of the above method and can be applied to manufacture Type E thermocouples (thermal piles) by depositing nickel and chromium to form a Chromel layer used for forming positive electrodes and depositing nickel and copper to form a Constantan layer used for forming negative electrodes. The processes for forming the nickel chromium alloy thin film and the composition ratio thereof are similar to the processes for the Type K thermocouples and the composition ratio thereof. The processes for forming the negative electrodes of the Type K thermocouples are changed to using nickel and copper powders. The composition ratio of nickel and cooper is properly adjusted. The preferred deposited thin film may comprise 45 to 46 weight percent of nickel and 54 to 55 weight percent of copper.

In another embodiment, the present invention can use the above processes to form temperature-sensing components (Type T thermocouples or thermal piles) by depositing copper to form positive electrodes and depositing nickel and copper to form negative electrodes. The processes for forming the negative electrodes and the composition ratio of nickel and copper are similar to the processes for forming the negative electrodes and the composition ratio of the Type E thermocouples, and the processes for depositing nickel-chromium alloy for the Type E thermocouples are replaced by the process of depositing copper.

In another embodiment, the present invention can use the above processes to form temperature-sensing components (Type J thermocouples or thermal piles) by depositing iron to form positive electrodes and depositing nickel and copper to form negative electrodes. The processes for forming the negative electrodes and the composition ratio of nickel and copper are similar to the processes for forming the negative electrodes and the composition ratio of the Type T thermocouples, and the processes for depositing copper to form positive electrodes of the Type T thermocouples are replaced by the process of depositing iron.

Subsequently, a battery socket is installed on the substrate, and insulating films are applied on horizontally and vertically disposed circuits for preventing moisture and dust penetration, causing short circuits or adversely affecting the performance of the accelerometers. Finally, a battery is installed and the accelerometers are ready for operation.

In summary, one embodiment of the present invention discloses a thermal convection-type accelerometer, which is built on an insulating substrate. The temperature-sensing components and the heaters of the accelerometer are directly formed on a planar supporting layer. Cavities are not necessary to be formed on the substrate in order to insulate the temperature-sensing components and the heaters from the substrate. As such, the accelerometers are with the following characteristics of: being easily made, endurable, and having higher acceleration operation capability, higher production yield rate, and lower cost.

The above-described embodiments of the present invention are intended to be illustrative only. Numerous alternative embodiments may be devised by persons skilled in the art without departing from the scope of the following claims.

What is claimed is:

1. A thermal convection-type accelerometer, comprising:
a first insulating substrate;
a circuit formed on the first insulating substrate;
a first acceleration-sensing device coupled with the circuit, comprising two first temperature-sensing components and a first heater disposed between the two first temperature-sensing components;
wherein the first heater is in a presence of a noble gas configured to prevent oxidation;
a first supporting layer having a first side and a second side opposite to the first side, wherein the first insulating substrate is attached to the first side, and the support layer is configured to prevent the insulating substrate from contacting the noble gas; and
wherein the first acceleration-sensing device is attached to the second side.

2. The thermal convection-type accelerometer of claim 1, comprising two first acceleration-sensing devices, wherein the circuit comprises two connecting points, and two first temperature-sensing components on opposite sides relative to the first heaters and from the two first acceleration-sensing devices, respectively, connect to a same one of the two connecting points.

3. The thermal convection-type accelerometer of claim 2, further comprising two second acceleration-sensing devices, each comprising two second temperature-sensing components and a second heater disposed between the two second temperature-sensing components, wherein the first heater and the two first temperature-sensing components of each first acceleration-sensing device are arranged along a direction different from a direction along which the second heater and the two second temperature-sensing components of each second acceleration-sensing device are arranged.

4. The thermal convection-type accelerometer of claim 1, wherein the first insulating substrate comprises a plurality of contact pads, which are arranged along an edge of the first insulating substrate; and the two first temperature-sensing components and the first heater are correspondingly coupled with the contact pads.

5. The thermal convection-type accelerometer of claim 1, further comprising:
a socket connector;
a plurality of terminals disposed in the socket connector, coupled with the circuit;
a second insulating substrate;
a plurality of contact pads arranged along an edge of the second insulating substrate, wherein the contact pads contact the terminals when the second insulating substrate is inserted into the socket connector;
a second acceleration-sensing device disposed on the second insulating substrate, comprising:
two second temperature-sensing components coupled with the contact pads; and
a second heater disposed between the two second temperature-sensing components, coupled with the contact pads; and
a second supporting layer attached to the second insulating substrate, wherein the second temperature-sensing components and the second heater are directly formed on the second supporting layer.

6. The thermal convection-type accelerometer of claim 5, comprising two second acceleration-sensing devices directly formed on the second insulating substrate.

7. The thermal convection-type accelerometer of claim 1, wherein the first insulating substrate comprises silicon nitride and silicon dioxide.

8. The thermal convection-type accelerometer of claim 1, wherein the first insulating substrate comprises polythiophene, polyethylene terephthalate or polyimide.

9. The thermal convection-type accelerometer of claim 1, wherein the first heater comprises nickel and chromium.

10. The thermal convection-type accelerometer of claim 1, further comprising an antenna directly formed on the first supporting layer.

11. The thermal convection-type accelerometer of claim 1, wherein the first temperature-sensing components comprises p-type amorphous silicon.

12. The thermal convection-type accelerometer of claim 1, further comprising a cover, wherein the cover is configured to seal the first acceleration-sensing device and the noble gas under the cover.

13. The thermal convection-type accelerometer of claim 1, wherein the first temperature-sensing components are coupled with a control and amplification device, which is a subtractor or an instrumentation amplifier.

14. The thermal convection-type accelerometer of claim 1, wherein each first temperature-sensing component comprises a plurality of thermocouples connected in series.

15. The thermal convection-type accelerometer of claim 14, wherein each thermocouple comprises a positive electrode and a negative electrode, wherein the positive electrode comprises Chromel and the negative electrode comprises Alumel.

16. The thermal convection-type accelerometer of claim 1, further comprising a cover configured to seal the first acceleration-sensing device, wherein one half of the thermocouples of each first temperature-sensing component are formed outside the cover for an ambient temperature compensator.

17. The thermal convection-type accelerometer of claim 1, further comprising two ambient temperature compensators, wherein the two ambient temperature compensators and the two first temperature-sensing components are alternatively connected in series.

* * * * *